(12) United States Patent
Glass et al.

(10) Patent No.: US 9,812,524 B2
(45) Date of Patent: *Nov. 7, 2017

(54) NANOWIRE TRANSISTOR DEVICES AND FORMING TECHNIQUES

(71) Applicant: INTEL CORPORATION, Santa Clara, CA (US)

(72) Inventors: Glenn A. Glass, Portland, OR (US); Kelin J. Kuhn, Alohoa, OR (US); Seiyon Kim, Portland, OR (US); Anand S. Murthy, Portland, OR (US); Daniel B. Aubertine, North Plains, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/155,806

(22) Filed: May 16, 2016

(65) Prior Publication Data
US 2016/0260802 A1 Sep. 8, 2016

Related U.S. Application Data

(63) Continuation of application No. 14/690,615, filed on Apr. 20, 2015, now Pat. No. 9,343,559, which is a (Continued)

(51) Int. Cl.
*H01L 27/092* (2006.01)
*H01L 29/06* (2006.01)
(Continued)

(52) U.S. Cl.
CPC ........ *H01L 29/0676* (2013.01); *H01L 21/845* (2013.01); *H01L 27/0924* (2013.01);
(Continued)

(58) Field of Classification Search
CPC ............. H01L 29/0676; H01L 29/7855; H01L 27/0924; H01L 29/42392; H01L 29/775;
(Continued)

(56) References Cited

U.S. PATENT DOCUMENTS 6,770,516 B2   8/2004   Wu et al.
6,855,588 B1   2/2005   Liao et al.
(Continued)

FOREIGN PATENT DOCUMENTS

CN   101292346 A    10/2008
DE   102005019568 A1   11/2006
(Continued)

OTHER PUBLICATIONS

Orlowski, et al., "Si, SiGe, Ge, and III-V Semiconductor Nanomembranes and Nanowires Enabled by SiGe Epitaxy," ECS Transactions, The Electrochemical Society, MA2010-02, Oct. 14, 2010. pp. 777-789.

(Continued)

*Primary Examiner* — Joseph C. Nicely
*Assistant Examiner* — Pavel Ivanov
(74) *Attorney, Agent, or Firm* — Finch & Maloney PLLC

(57) ABSTRACT

Techniques are disclosed for customization of nanowire transistor devices to provide a diverse range of channel configurations and/or material systems within the same integrated circuit die. In accordance with one example embodiment, sacrificial fins are removed and replaced with custom material stacks of arbitrary composition and strain suitable for a given application. In one such case, each of a first set of the sacrificial fins is recessed or otherwise removed and replaced with a p-type layer stack, and each of a second set of the sacrificial fins is recessed or otherwise removed and replaced with an n-type layer stack. The p-type layer stack can be completely independent of the process for (Continued)

the n-type layer stack, and vice-versa. Numerous other circuit configurations and device variations are enabled using the techniques provided herein.

20 Claims, 18 Drawing Sheets

Related U.S. Application Data continuation of application No. 13/560,531, filed on Jul. 27, 2012, now Pat. No. 9,012,284, which is a continuation-in-part of application No. PCT/US2011/067225, filed on Dec. 23, 2011.

(51) Int. Cl.
| | |
|---|---|
| H01L 21/84 | (2006.01) |
| H01L 27/12 | (2006.01) |
| H01L 29/786 | (2006.01) |
| H01L 29/66 | (2006.01) |
| H01L 29/775 | (2006.01) |
| H01L 29/423 | (2006.01) |
| H01L 29/78 | (2006.01) |

(52) U.S. Cl.
CPC .... *H01L 27/1211* (2013.01); *H01L 29/42392* (2013.01); *H01L 29/66439* (2013.01); *H01L 29/66545* (2013.01); *H01L 29/775* (2013.01); *H01L 29/7855* (2013.01); *H01L 29/78696* (2013.01)

(58) Field of Classification Search
CPC ......... H01L 29/66439; H01L 29/66545; H01L 29/78696; H01L 21/845; H01L 27/1211
USPC ........... 438/275, 284; 257/24, 369, E21.632, 257/E21.062
See application file for complete search history.

(56) References Cited

U.S. PATENT DOCUMENTS

| | | | |
|---|---|---|---|
| 7,026,199 B2 | 4/2006 | Lee | |
| 7,051,945 B2 | 5/2006 | Empedocles et al. | |
| 7,074,662 B2 | 7/2006 | Lee et al. | |
| 7,354,831 B2 | 4/2008 | Orlowski | |
| 7,402,483 B2 | 7/2008 | Yun et al. | |
| 7,479,421 B2 | 1/2009 | Kavalieros et al. | |
| 7,560,319 B2 | 7/2009 | Kang et al. | |
| 7,566,364 B2 | 7/2009 | Xianyu et al. | |
| 7,892,945 B2 | 2/2011 | Bedell et al. | |
| 8,084,308 B2 | 12/2011 | Chang et al. | |
| 8,399,314 B2 | 3/2013 | Cohen et al. | |
| 8,753,942 B2 | 6/2014 | Kuhn et al. | |
| 9,012,284 B2 | 4/2015 | Glass et al. | |
| 9,343,559 B2 | 5/2016 | Glass et al. | |
| 2005/0095793 A1 | 5/2005 | Lee | |
| 2006/0024874 A1 | 2/2006 | Yun et al. | |
| 2006/0216897 A1 | 9/2006 | Lee et al. | |
| 2006/0240622 A1 | 10/2006 | Lee et al. | |
| 2007/0004124 A1 | 1/2007 | Suk et al. | |
| 2007/0231976 A1 | 10/2007 | Kang et al. | |
| 2008/0017934 A1 | 1/2008 | Kim et al. | |
| 2008/0135949 A1 | 6/2008 | Lo et al. | |
| 2009/0065853 A1 | 3/2009 | Hanafi | |
| 2010/0187503 A1 | 7/2010 | Moriyama et al. | |
| 2010/0193770 A1 | 8/2010 | Bangsaruntip et al. | |
| 2010/0295021 A1 | 11/2010 | Chang et al. | |
| 2010/0297816 A1 | 11/2010 | Bedell et al. | |
| 2011/0012090 A1 | 1/2011 | Singh et al. | |
| 2011/0031473 A1 | 2/2011 | Chang et al. | |
| 2011/0233522 A1 | 9/2011 | Cohen et al. | |
| 2011/0303972 A1 | 12/2011 | Saitoh et al. | |
| 2012/0007052 A1 | 1/2012 | Hobbs et al. | |
| 2012/0129354 A1 | 5/2012 | Luong | |
| 2012/0138886 A1 | 6/2012 | Kuhn et al. | |
| 2013/0161756 A1 | 6/2013 | Glass et al. | |
| 2014/0131660 A1 | 5/2014 | Cea et al. | |
| 2014/0197377 A1 | 7/2014 | Kim et al. | |
| 2015/0228772 A1 | 8/2015 | Glass et al. | |

FOREIGN PATENT DOCUMENTS

| | | |
|---|---|---|
| JP | 2010272859 A | 12/2010 |
| KR | 1020050033200 | 10/2006 |
| TW | 201123429 A | 7/2011 |
| WO | 2008034850 A2 | 3/2008 |
| WO | 2010094360 A1 | 8/2010 |
| WO | 2012074872 A2 | 6/2012 |
| WO | 2013095646 A1 | 6/2013 |

OTHER PUBLICATIONS

TW Official Letter and Search Report with English Translation. dated Oct. 23, 2013. 13 pages.
International Search Report and Written Opinion received for Patent Application No. PCT/US2013/047146, dated Sep. 25, 2013, 9 pages.
International Search Report and Written Opinion received for PCT Application No. PCT/US2011/067225 dated Sep. 24, 2012, 5 Pages
International Search Report and Written Opinion received for PCT Application No. PCT/US2011/062059 dated Jul. 27, 2012, 5 Pages.
International Preliminary Report on Patentability and Written Opinion received for PCT Application No. PCT/2013/0347146. dated Feb. 5, 2015. 6 pages.
TW Search Report (English Translation) received in Taiwan Patent Application No. 102124695, dated Jul. 6, 2015, 2 pages.

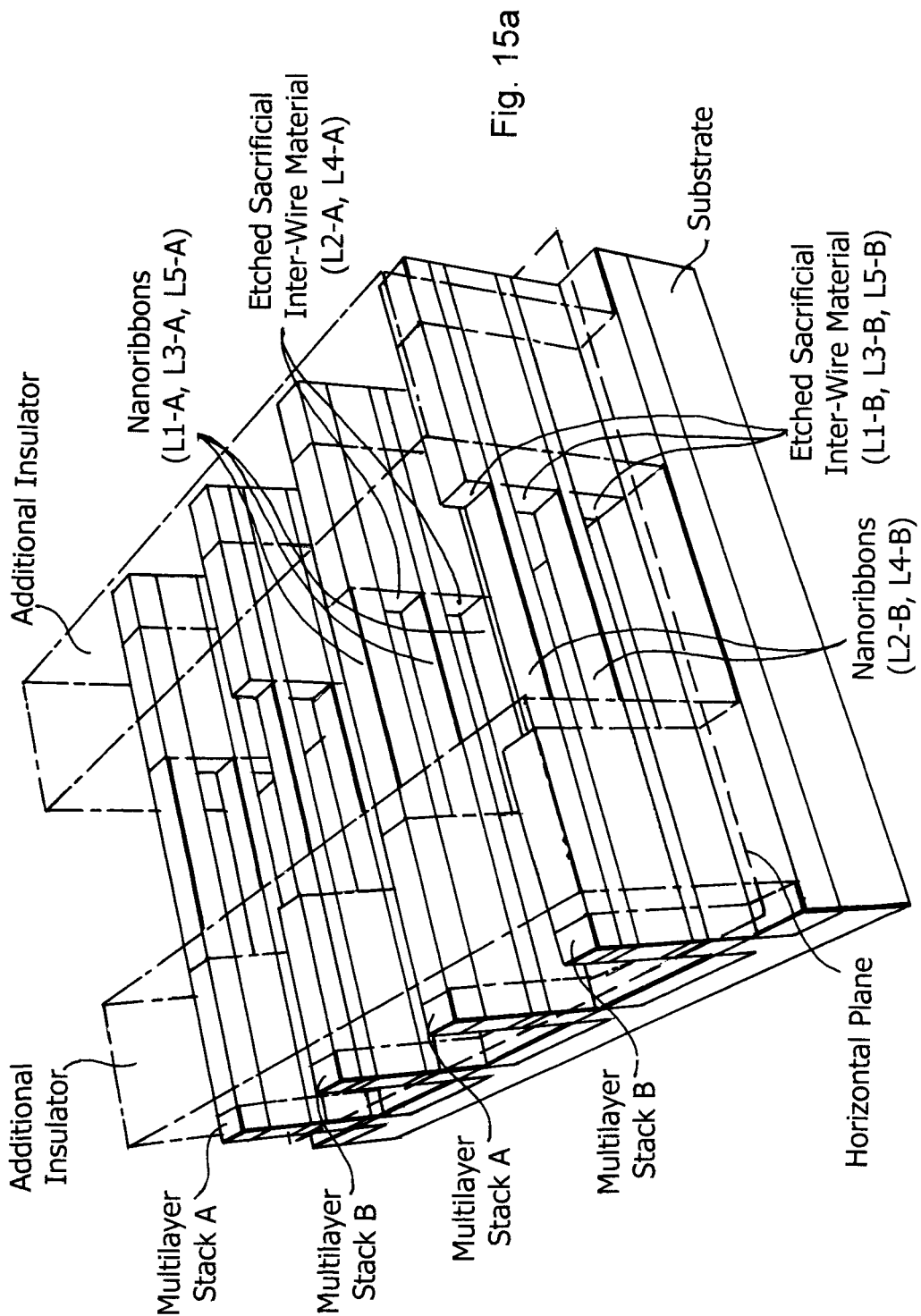

NANOWIRE TRANSISTOR DEVICES AND FORMING TECHNIQUES

RELATED APPLICATIONS

This application is a continuation of U.S. patent application Ser. No. 14/690,615, filed Apr. 20, 2015, (now U.S. Pat. No. 9,343,559), which is a continuation of U.S. patent application Ser. No. 13/560,531, filed Jul. 27, 2012, (now U.S. Pat. No. 9,012,284), which is a continuation-in-part of PCT Application No. PCT/US2011/067225, filed Dec. 23, 2011. Each of these applications is herein incorporated by reference in its entirety.

BACKGROUND

Maintaining mobility improvement and short channel control as microelectronic device dimensions continue scale provides a challenge in device fabrication. Nanowire transistor devices can be used to provide improved short channel control. For example, silicon germanium ($Si_xGe_{1-x}$, where x<0.2) nanowire channel structures provide mobility enhancement, which is suitable for use in many conventional products.

BRIEF DESCRIPTION OF THE DRAWINGS

FIGS. 1 through 15b illustrate a process for forming nanowire or nanoribbon transistor devices, as well as various example resulting structures, in accordance with an embodiment of the present disclosure.

Figure 1:
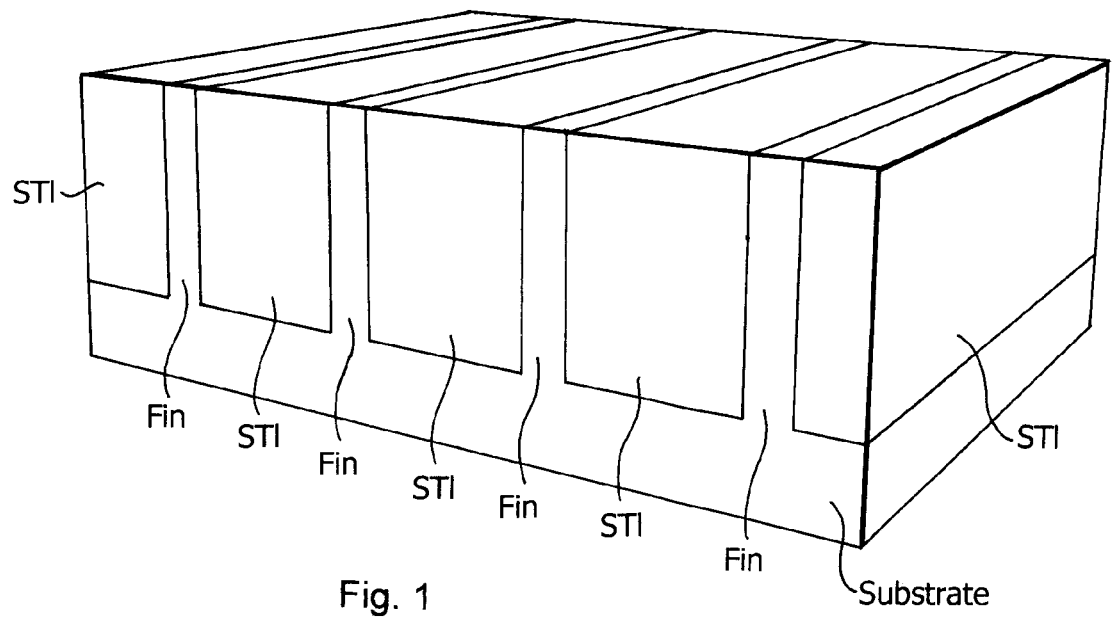

As will be appreciated, the figures are not necessarily drawn to scale or intended to limit the present disclosure to the specific configurations shown. For instance, while some figures generally indicate straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for customization of nanowire transistor devices to provide a diverse range of channel configurations and/or material systems, and within the same integrated circuit die. In accordance with an embodiment of the present disclosure, sacrificial fins are removed and replaced with custom material stacks of arbitrary composition and strain suitable for a given application. In one such embodiment, each of a first set of the sacrificial fins is recessed or otherwise removed and replaced with a p-type layer stack, and each of a second set of the sacrificial fins is recessed or otherwise removed and replaced with an n-type layer stack. The p-type layer stack can be completely independent of the process for the n-type layer stack, and vice-versa. Numerous other circuit configurations and device variations are enabled using the techniques provided herein.

General Overview

The multi-gate transistor has evolved from planar (single gate) to fin (dual or tri-gate) to the gate-all-around or so called nanowire/nanoribbon devices. The distinction between 'wire' and 'ribbon' is semantic where a nanowire would generally have a height to width ratio of 1:1 whereas a nanoribbon would be asymmetric in height to width ratio, although other distinctions between the terms may be possible. In any case, the two terms are used herein interchangeably and the concepts and techniques herein described are equally applicable to both geometries, as will be appreciated in light of this disclosure. Nanowire devices are generally fabricated from a two-dimensional planar stack of, for instance, silicon germanium (SiGe) alloy and silicon layers. In the context of a complementary metal oxide semiconductor (CMOS) process that uses both p-type and n-type metal oxide semiconductor transistors (PMOS and NMOS, respectively), use of a common layer stack for p-type and n-type transistors creates a number of non-trivial limitations. For instance, the composition of layer stacks in the p-type and n-type regions must be identical. In addition, the thickness of layer stacks in the p-type and n-type regions must be identical. In other known approaches, a multiple epitaxial layer structure (superlattice) is fabricated and subsequently disassembled/partitioned using a first portion for NMOS and a second portion for PMOS nanowire devices. However, growing thick strained layers is difficult due to strain relaxation issues, particularly as fin geometries get taller. Strain relaxation may cause, for example, excessive defects in the epi layer and degrade device performance, yield, and reliability.

Thus, in accordance with an embodiment of the present disclosure, an initial structure is provided with patterned sacrificial fins in a shallow trench isolation matrix. After trench isolation processing, the sacrificial fins (or subset of the fins) are removed and replaced with epitaxial material stacks of arbitrary composition and strain suitable for a given application. In one such embodiment, each of a first set of the sacrificial fins is recessed or otherwise removed and replaced with a p-type layer stack, and each of a second set of the sacrificial fins is recessed or otherwise removed and replaced with an n-type layer stack. As will be appreciated in light of this disclosure, the p-type layer stack can be completely independent of the process for the n-type layer stack, and vice-versa.

Numerous other circuit configurations and device variations are enabled using the techniques provided herein, as will be appreciated in light of this disclosure. For instance, another example circuit can be implemented with custom thickness tuning for active wire components as opposed to sacrificial inter-wire components. Various wire/ribbon dimensions can be tuned to provide a desired effect (e.g., transistor density, channel strain, current density, wires as opposed to ribbons, etc). Another embodiment may be configured with custom numbers of wires per transistor for p-type and/or n-type portions (e.g., a given circuit design where n-type transistors have three or five wires, and p-type transistors have two or four wires). In a more general sense, another embodiment may be configured with custom numbers of wires per transistor for a first circuit type and a second circuit type. For instance, a given configuration may include multiple types of NMOS (or PMOS) transistors such as those having one, two, and/or four nanowires per transistor, or those having a common number of nanowires per transistor but a different channel material for some of the transistors. Another embodiment may be configured with custom layer dimensions and/or composition within the circuit die (e.g., with suitable masking or selective deposition).

Another embodiment may be configured with different fins and/or material layer stacks. For instance, one such embodiment may be configured with fins for one device type, and wires for another device type. One specific such example circuit may be configured with $Si_xGe_{1-x}$ fins where x=0.25, as well as multilayer stacks of $Si_xGe_{1-x}$ and silicon where x=0.4; another such example circuit may be configured with column IV material fins and III-V material multilayer stacks (or III-V fins and IV multilayer stacks). Another embodiment may be configured with multiple fin types. For instance, one example circuit may be configured with gallium arsenide fins for NMOS, as well as SiGe fins for PMOS. Diversity with respect to device polarity and/or channel composition is effectively unlimited when employing the various techniques provided herein.

Such techniques as provided herein enable significant customization of nanowire stacks to provide a diverse range of configurations and/or material systems. A scanning electron microscopy (SEM) or transmission electron microscopy (TEM) cross-section perpendicular to gate lines or Fins can be used to show the custom nanowire stacks in non-planar transistor structures, in accordance with some embodiments of the present disclosure. For instance, in some such embodiments, the SEM/TEM cross-section will show p-type channel wires having a first configuration, and n-type channel wires having a second configuration that is different from the first.

Methodology and Architecture

FIGS. 1 through 15b illustrate a process for forming nanowire transistor devices, as well as various example resulting structures, in accordance with an embodiment of the present disclosure. As can be seen, this example process employs a recess-and-replace technique in forming nanowires, which in turn yields structures that are distinct from structures formed from a pre-fabricated two-dimensional planar stack of multiple layers that is patterned into fins. For instance, structures implemented in accordance with an embodiment of the present disclosure may exhibit diverse channel materials and/or configurations, which are formed in the context of a self-aligning process by virtue of the recess provided upon removal of the sacrificial fin material.

FIG. 1 illustrates a structure resulting from the patterning of sacrificial fins and a shallow trench isolation (STI) process. As can be seen, a substrate is provided. The substrate can be, for example, a blank substrate that is to be prepared for subsequent semiconductor processes by forming a number of sacrificial fin structures therein. Alternatively, the substrate can be a partially formed semiconductor structure upon which sacrificial fin structures are preformed. Still in other embodiments, the substrate can be a partially formed semiconductor structure upon which sacrificial fin structures were formed and, after an STI process, were subsequently recessed or otherwise removed to provide fin recesses. Thus, the substrate may come blank, or with preformed fins, or with preformed fins and STI, or with preformed STI and fin recesses. In one such example embodiment, the substrate comes with preformed fins and STI, wherein the top of some of the fins is flush with the top surface of the STI, and the top of at least some of the other fins is below the top surface of the STI such that they are pre-recessed or otherwise fabricated to be shorter than the fins flush with the STI. In this sense, note that the act of fin recessing is not necessarily required, so long as fins are provided having a top that is below the STI.

Any number of suitable substrate configurations can be used here, including bulk substrates, semiconductors on insulator substrates (XOI, where X is a semiconductor material such as Si, Ge or Ge-enriched Si), and multi-layered structures. In a more general sense, any substrate upon which sacrificial fins can be formed prior to a subsequent transistor formation process can be used. In one specific example case, the substrate is a silicon bulk substrate. In other implementations, the semiconductor substrate may be formed using alternate materials, which may or may not be combined with silicon, that include but are not limited to germanium, indium antimonide, lead telluride, indium arsenide, indium phosphide, gallium arsenide, or gallium antimonide. Further semiconductor materials classified as group III-V or group IV materials may also be used to form the substrate. Although a few examples of materials from which the substrate may be formed are described here, any material that may serve as a foundation upon which a semiconductor device may be built falls within the spirit and scope of the present disclosure.

The sacrificial fins can be formed using any number of suitable processes. Some embodiments may employ, for example, the deposition and patterning of a hardmask on the substrate. This can be carried out using standard photolithography, including deposition of or more hardmask materials (e.g., such as silicon dioxide, silicon nitride, and/or other suitable hardmask materials), patterning resist on a portion of the hardmask that will remain temporarily to protect an underlying region of the fin (such as a diffusion or active area of a transistor device), etching to remove the unmasked (no resist) portions of the hardmask (e.g., using a dry etch, or other suitable hardmask removal process), and then stripping the patterned resist material, thereby leaving the patterned mask. In some such embodiments, the resulting hardmask is a two-layer hardmask configured with a bottom layer of oxide (e.g., native oxide, such as silicon dioxide resulting from oxidation of silicon substrate) and top layer of silicon nitride. Any number of suitable mask configurations can be used in forming the sacrificial fins, as will be apparent. While the illustrated embodiment shows fins as having a width that does not vary with distance from the substrate, the fin may be narrower at the top than the bottom in another embodiment, wider at the top than the bottom in another embodiment, or having any other width variations and degrees of uniformity (or non-uniformity). Further note that the width variation may, in some embodiments, be symmetrical or asymmetrical. Also, while the fins are illustrated as all having the same width, some fins may be wider and/or otherwise shaped differently than others. For example, in an embodiment, fins to be used in the creation of NMOS transistors may be narrower than fins to be used in the creation of PMOS transistors. Other arrangements are possible, as will be appreciated.

As can be further seen in FIG. 1, shallow trenches are provisioned in the substrate and subsequently filled with an insulating material so as to provide shallow trench isolation (STI) about a plurality of fins, in accordance with an embodiment of the present disclosure. Any number of fins can be provided, and in any desired pattern or configuration suitable for a given application. The shallow trench etch can be accomplished, for example, with standard photolithography including wet or dry etching, or a combination of etches if so desired. The geometry of the trenches (width, depth, shape, etc) can vary from one embodiment to the next as will be appreciated, and the present disclosure is not intended to be limited to any particular trench geometry. In one specific example embodiment having a bulk silicon substrate and a two-layer hardmask implemented with a bottom silicon dioxide ($SiO_2$) layer and a top silicon nitride layer, a dry etch is used to form the trenches that are about, for instance, 100 Å to 5000 Å below the top surface of the substrate. Any number of trench configurations can be used depending on the desired fin height, as will be apparent. The trenches can be subsequently filled using any number of suitable deposition processes. In one specific example embodiment having a silicon substrate, the insulating STI fill material is $SiO_2$, but any number of suitable isolation dielectric materials can be used to form the shallow trench isolation (STI) structures here. In general, the deposited or otherwise grown isolation dielectric material for filling the trenches can be selected, for example, based on compatibility with the native oxide of the substrate material. Note that the STI trenches may be circular or polygonal in nature, and any reference to trench 'sides' is intended to refer to any such configurations, and should not be interpreted to imply a particular geometric shaped structure. FIG. 1 further demonstrates how the STI insulation material can be planarized using, for example, chemical mechanical planarization (CMP) or other suitable process capable of planarizing the structure. In the example embodiment shown, the mask over the sacrificial fins is completely removed. Other embodiments may utilize a selective planarization configured to leave a portion of the mask in place, which can be used in subsequent processing, such as shown in FIG. 2.

Figure 2:
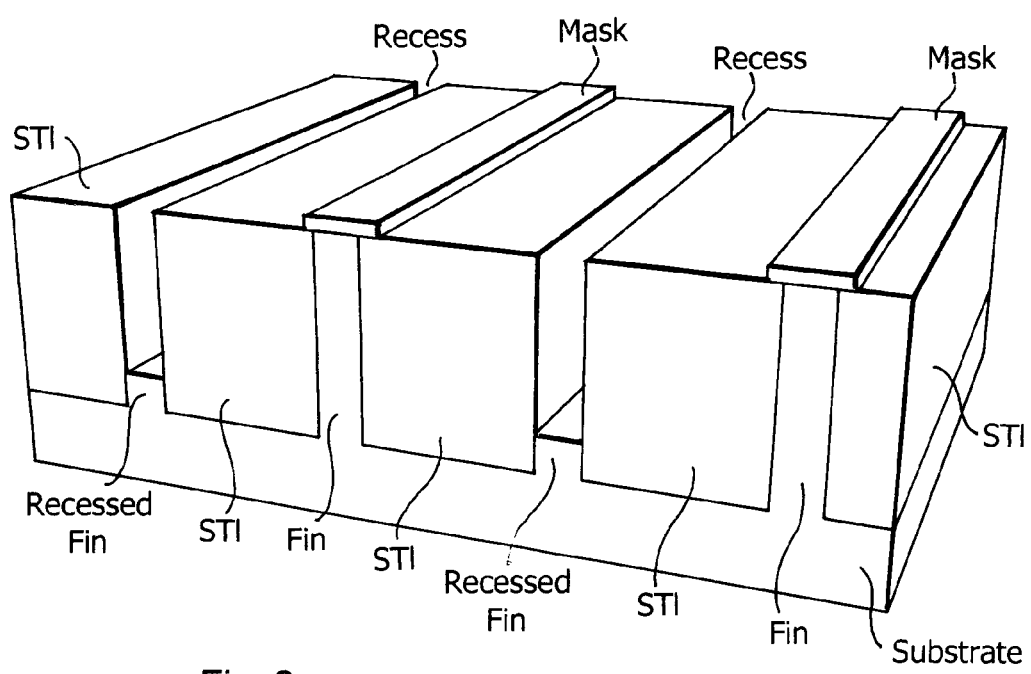

FIG. 2 illustrates a process and resulting structure wherein some of the fins are masked and others are recessed, in accordance with an embodiment of the present disclosure. In this example case, there are four fins shown, with two being masked and two being recessed, in an alternating manner (e.g., recessed, masked, recessed, masked). The mask can be, for example, provisioned anew or left over from the STI process as previously described. In any case, the mask can be any suitable material that will withstand the recess etch of the unmasked fins and subsequent processing to fill those recesses (such as epitaxial processing). Any suitable etch process can be used (e.g., wet and/or dry etch with masking and/or etch selectivity). In one example embodiment, the recess etch is a selective etch that will remove the unmasked fin material but not the STI or mask materials. In such a case, note that the mask material may also be implemented with the STI material (e.g., silicon dioxide) or any other material resistant to the fin recess etch (e.g., silicon nitride). In one specific example embodiment, the sacrificial fins are silicon and the mask is silicon dioxide and/or silicon nitride, and the recess etch is carried out using a wet etch (e.g., potassium hydroxide or other suitable etchant that will etch the unmasked silicon fins but not the STI and mask). The depth of the sacrificial fin etch can vary from one embodiment to the next, and may leave a pedestal (as shown in FIG. 2), or a recess into the substrate past the original fin bottom (effectively, the mirror image of a pedestal across the x-axis), or flush with the bottom of the STI trench. As will be appreciated in light of this disclosure, the depth of the fin recess will depend on factors such as the number of wires and/or ribbons per transistor, substrate thickness, and/or fin height. In some embodiments, the etching process may alter the width of recesses, with the top of the trench being wider than the bottom in some such cases. In another embodiment where the original sacrificial fin was wider at the bottom than the top, the top may be widened to be closer to or exceed the width at the bottom. In yet another embodiment, the recess may end up with a slightly hourglass shape, wider at the top and bottom than in the middle. In yet another embodiment, the width may be substantially unchanged by the etching process. In a more general sense, the shape of the recess/fin may be changed by the etching process, but not necessarily so.

Figure 3:
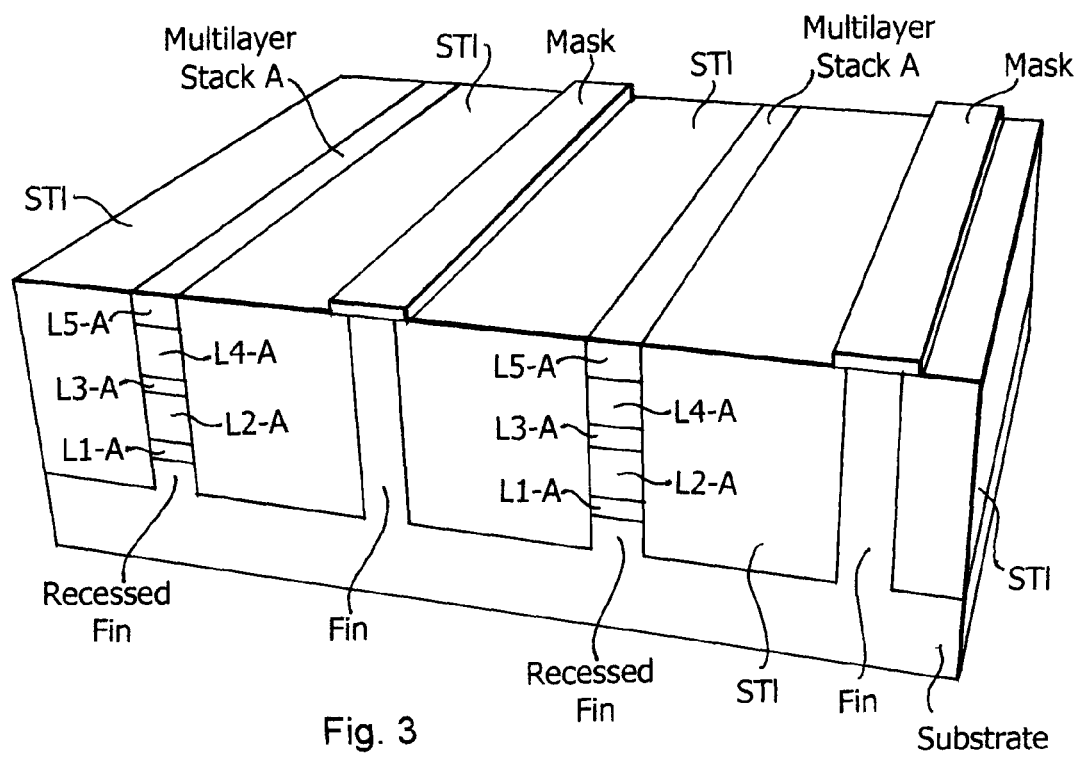

FIG. 3 illustrates a process that involves selectively growing or otherwise forming a multilayer stack in each of the recessed fins, and then planarizing as necessary, in accordance with an embodiment of the present disclosure. As can be seen in this example case, the recessed fins have been filled with a particular multilayer stack configuration that includes five layers (L1-A through L5-A). Each of the layers L1-A through L5-A can be configured as desired with respect to any number of parameters of interest, such as layer thickness, polarity, doping, composition and/or strain. Each stack generally includes one or more layers that will form a nanowire or nanoribbon (depending on width to height ratio), and one or more layers that are sacrificial inter-wire material (or spacer material). The resulting multilayer fin structures are generally designated multilayer stack A in FIG. 3, and may also be referred to as type A multilayer stacks. Note that, in some embodiments, the planarization process for the multilayer stacks A can also be used to remove the mask from the remaining sacrificial fins, to facilitate their subsequent processing.

Figure 4:
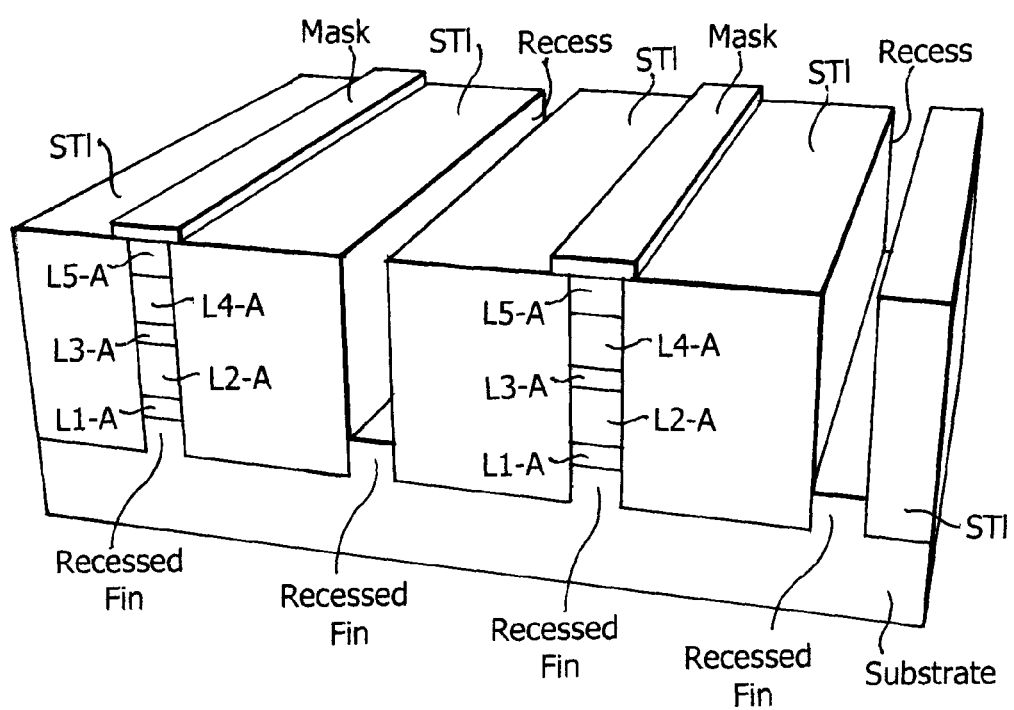

FIG. 4 illustrates a process and resulting structure wherein some of the finished fins (type A multilayer stacks) are masked, and the other remaining fins are recessed, in accordance with an embodiment of the present disclosure. The previous discussion with respect to masking and recessing fins with respect to FIG. 2 is equally applicable here. Any number of suitable masking and/or selective etch processes can be used, and the present disclosure is not intended to be limited to any particular process.

Figure 5:
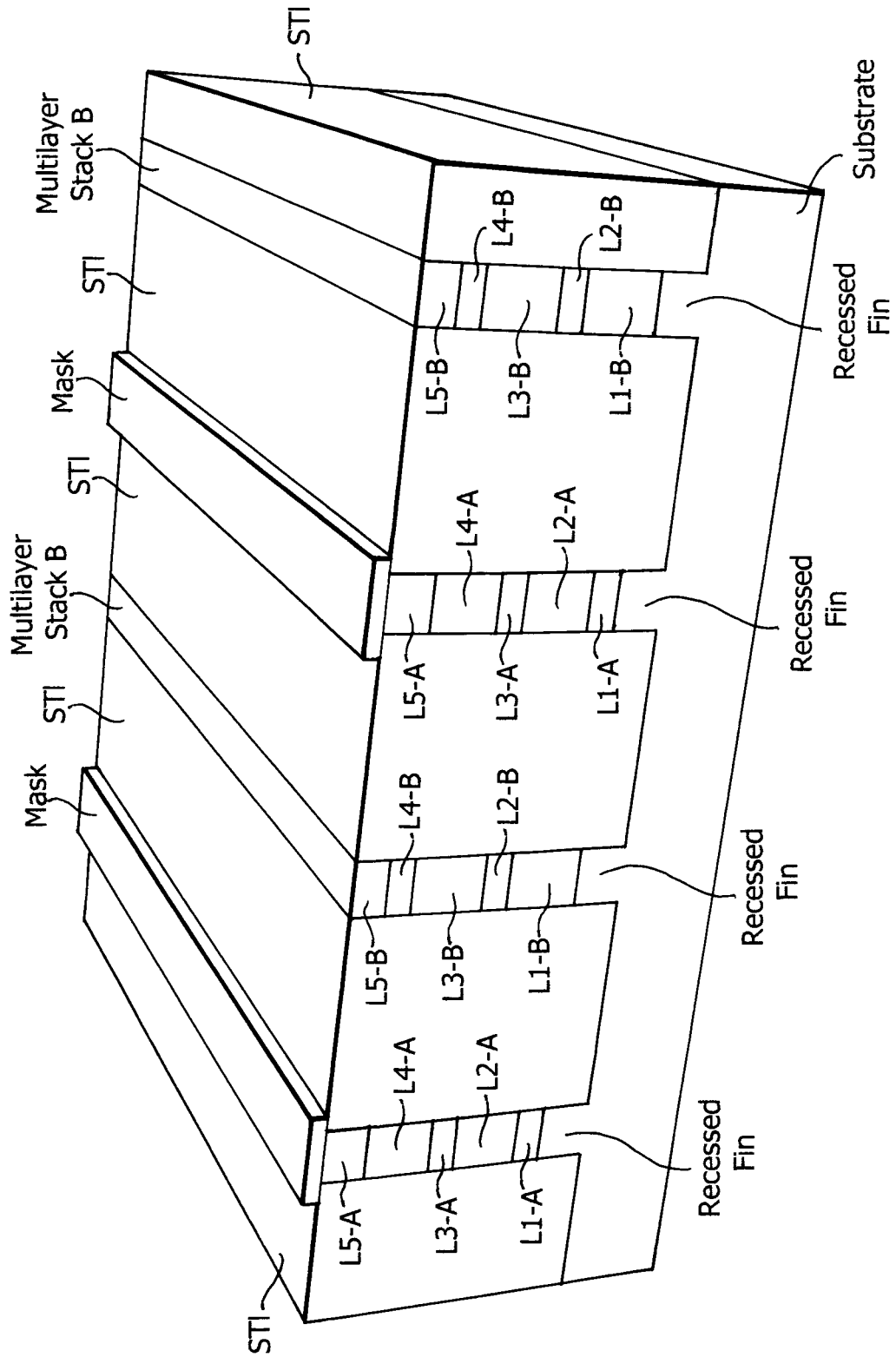

FIG. 5 illustrates a process that involves selectively growing or otherwise forming a multilayer stack in each of the recessed fins formed in FIG. 4, and then planarizing as necessary, in accordance with an embodiment of the present disclosure. As can be seen in this example case, the recessed fins of this second set have been filled with a particular multilayer stack configuration that also happens to include five layers (L1-B through L5-B). Each of the layers L1-B through L5-B can be configured as desired with respect to any number of parameters of interest, such as layer thickness, composition, polarity, doping, and/or strain. The resulting multilayer fin structures of this process are generally designated multilayer stack B in FIG. 5, and may also be referred to as type B multilayer stacks. Just as with type A stacks, each type B stack generally includes one or more layers that will form a nanowire or nanoribbon (depending on width to height ratio), and one or more layers that are sacrificial inter-wire material (or spacer material). Note that the type A layer stacks can be completely independent of the process for the type B layer stacks, and vice-versa. Thus, the number of stack layers in one type of stack may be different than the number of layers in another type of stack, in accordance with other embodiments.

Figure 6:
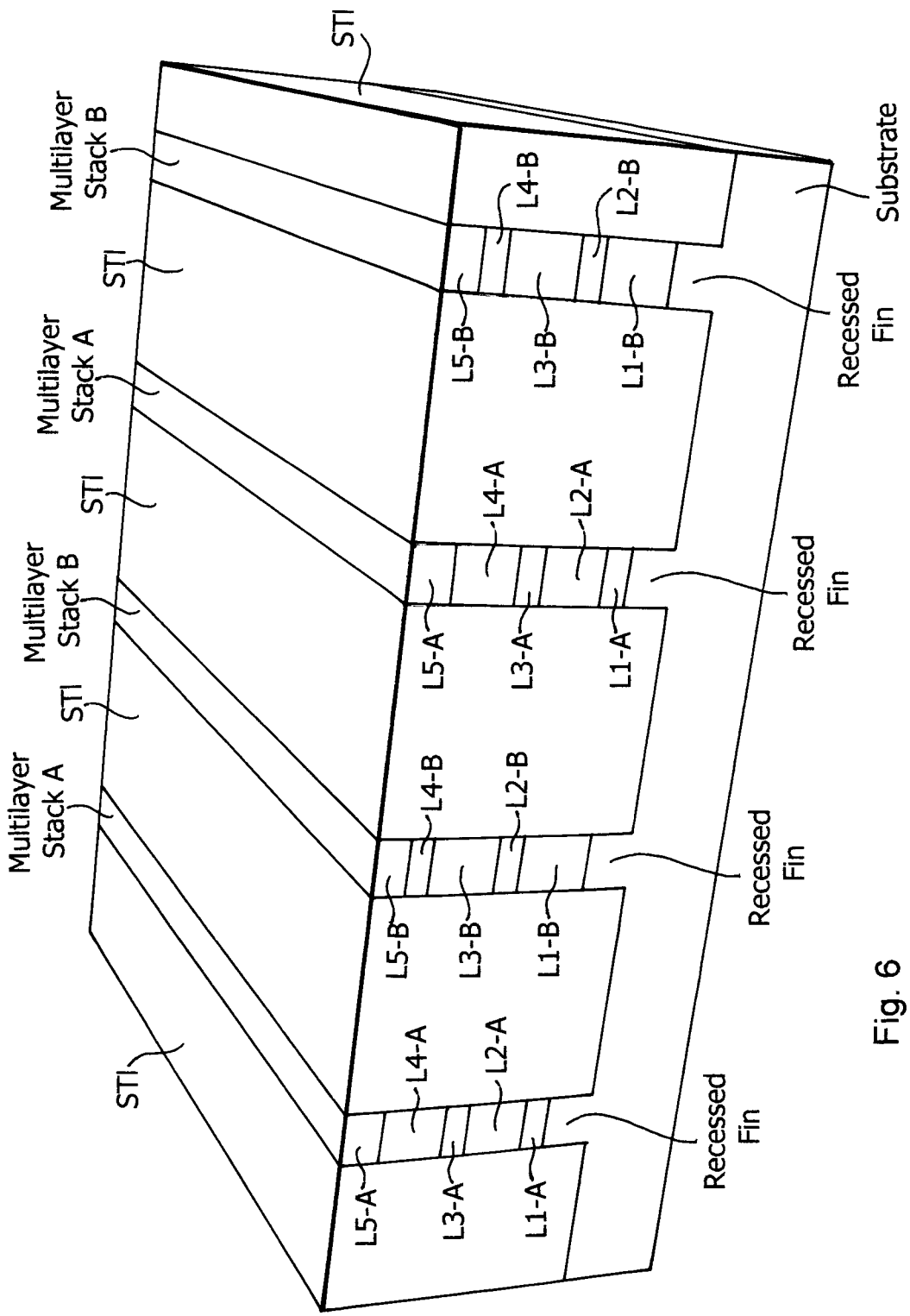

FIG. 6 illustrates the resulting structure after a process that removes the masking layer is carried out, and after any desired planarization, in accordance with an embodiment of the present disclosure. Note that the planarization can be local to where needed, and may use the top of the STI layer and/or the unmasked fins as an effective etch stop. As will be appreciated in light of this disclosure, the resulting structure configured with multilayer stacks of types A and B can be used for numerous applications. In a CMOS application, for instance, the type A multilayer stack may be configured into NMOS transistors and the type B multilayer stack may be configured into PMOS transistors. Alternatively, the type A multilayer stack may be configured into a first type of NMOS transistors, and type B multilayer stack may be configured into a second type of NMOS transistors. Alternatively, the type A multilayer stack may be configured into a first type of PMOS transistors, and type B multilayer stack may be configured into a second type of PMOS transistors. Moreover, note that other embodiments may have any number of diverse multilayer stacks, and the present disclosure is not intended to limited to two types as shown. For instance, one embodiment may include four distinct multilayer stack types A, B, C, and D, wherein the type A multilayer stacks are configured into a first type of NMOS transistors, the type B multilayer stacks are configured into a first type of PMOS transistors, the type C multilayer stacks are configured into a second type of NMOS transistors, and the type D multilayer stacks are configured into a second type of PMOS transistors. Another example embodiment may include, in addition to any provisioned multilayer stacks as described herein, one or more unrecessed fins so as to provide a mix of recess-and-replace based transistors and original fin based transistors in the same integrated circuit. In a more general sense, any arbitrary number of permutations of stack types can be implemented (with or without original fins), as will be appreciated in light of this disclosure.

Figure 7:
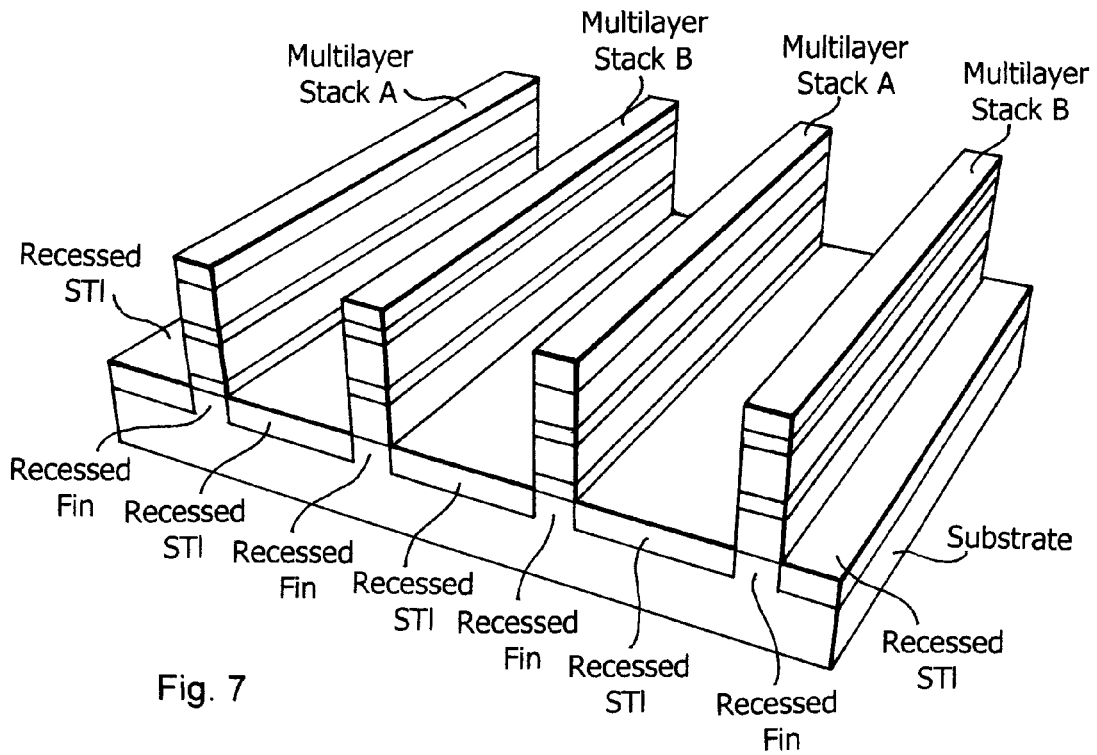

FIG. 7 illustrates a process and resulting structure wherein the trench oxide (or other STI material) of the structure shown in FIG. 6 is recessed, in accordance with an embodiment of the present disclosure. This can be carried out, for example, by masking the finished multilayer stacks A and B and etching the STI to a suitable depth, or without a mask by using a selective etch scheme. Any suitable etch process (e.g., wet and/or dry) can be used. For instance, in one specific example embodiment, wherein the STI is implemented with silicon dioxide and each of the top layers of the multilayers stacks A and B is implemented with silicon, the STI recess process can be carried out using hydrofluoric acid or other suitable etchant that is selective to the non-STI material. As will be appreciated, a mask that is impervious or otherwise suitably resistant to the STI etchant can be patterned to protect the multilayer stacks A and B, if necessary. The depth of the STI recess can vary from one embodiment to the next, and in this example embodiment is flush with the top of the remaining sacrificial fin material (or pedestal). As will be further appreciated in light of this disclosure, the depth of the STI recess will depend on factors such as the number of wires and/or ribbons per transistor, STI thickness and desired isolation, and/or fin height. In various embodiments, this partial removal of STI may alter the width of one or more of the multilayer stacks A and B, with the top of the stack ending up relatively narrower than the bottom of the stack in an embodiment. In other embodiments, the relative widths along the height of the stacks may remain relatively unchanged. In some embodiments, stacks A and B may comprise different materials, with one stack having its width changed more than the other stack. Such width variations as described here and with respect to FIG. 2 may be applicable to any of the etching processes described in this disclosure.

Figure 8:
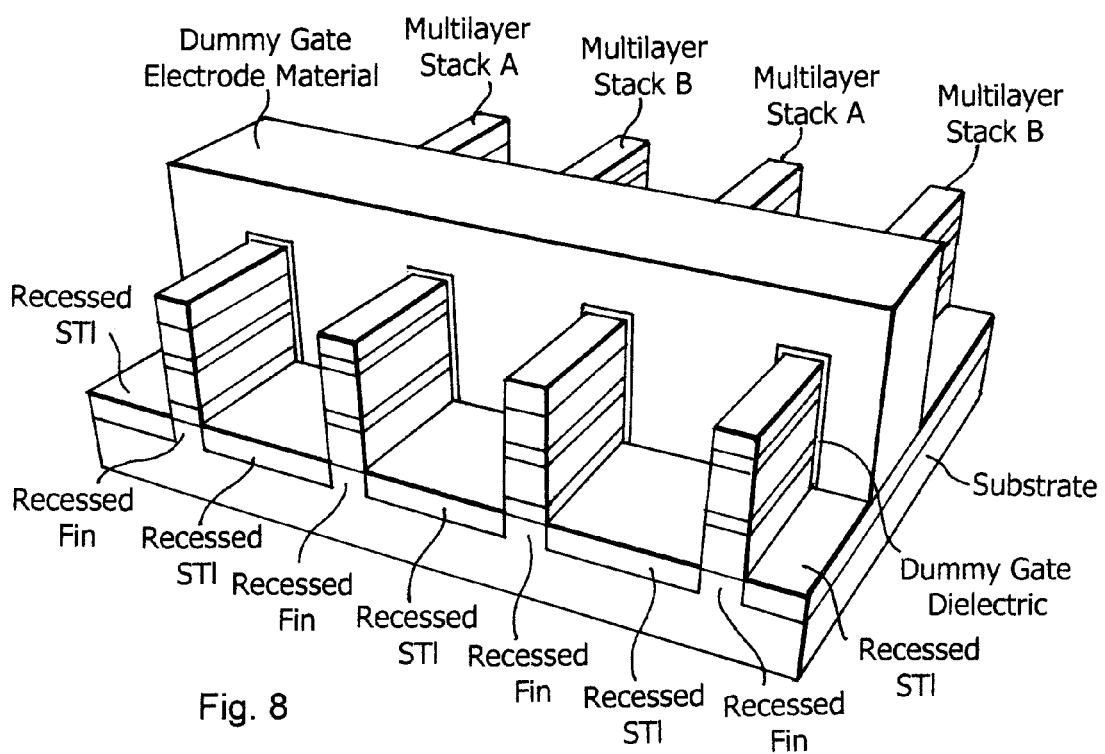

FIG. 8 illustrates a process and resulting structure wherein a dummy gate electrode material is deposited over the multilayer stacks A and B, and then patterned to form a plurality of sacrificial gates, in accordance with an embodiment of the present disclosure. As is further shown, a dummy gate dielectric may be provisioned prior to deposition of the dummy gate electrode material. This gate dielectric is referred to as a dummy gate dielectric in the sense that it can be removed and replaced in a subsequent process in some embodiments. Note, however, that in other embodiments a gate dielectric intended for the final structure can be used. Example dummy gate dielectric materials include, for instance, silicon dioxide, and example dummy gate electrode material includes polysilicon, although any suitable dummy/sacrificial gate dielectric and/or electrode materials can be used. As will be appreciated, the dimensions of the gate materials will vary from one embodiment to the next and can be configured as desired, depending on factors such as the desired device performance attributes, device size, and gate isolation.

Figure 9:
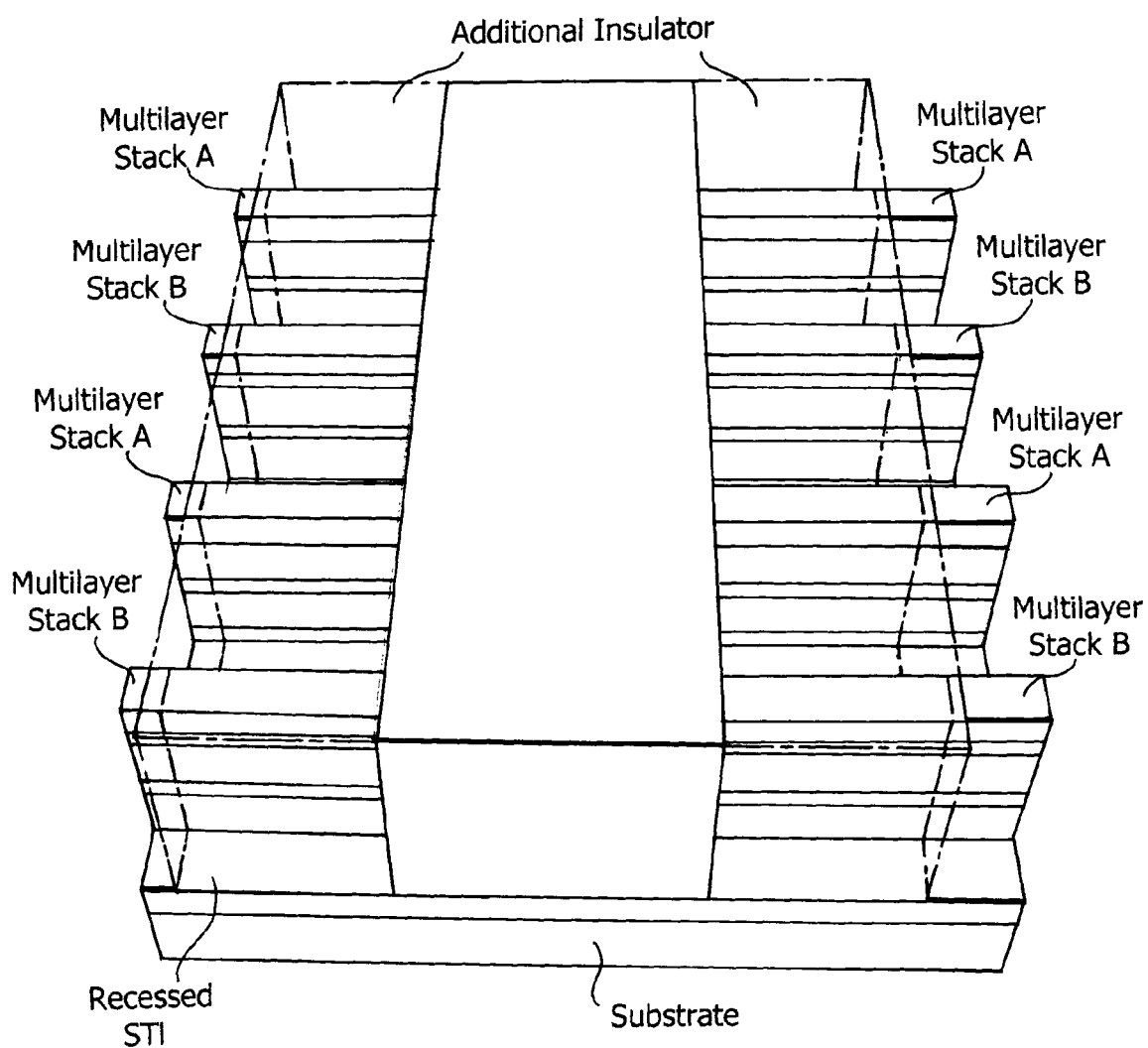

FIG. 9 illustrates a process and resulting structure wherein additional insulator layer(s) are deposited and planarized to the top of the dummy gate electrode material, in accordance with an embodiment of the present disclosure. Any suitable deposition process (e.g., CVD, PVD, ALD, etc) can be used, and the deposited insulator material may be, for example, the same material as the STI fill material (e.g., silicon dioxide) or any suitable material having the desired insulating/dielectric properties for a given application. Planarization of the additional insulator material can be carried out, for example, using CMP with the dummy gate electrode material as an etch stop. Alternatively, the CMP process can proceed into the dummy gate electrode to provide a dummy gate electrode having a specific height above the tops of the multilayer stacks A and B.

Figure 10:
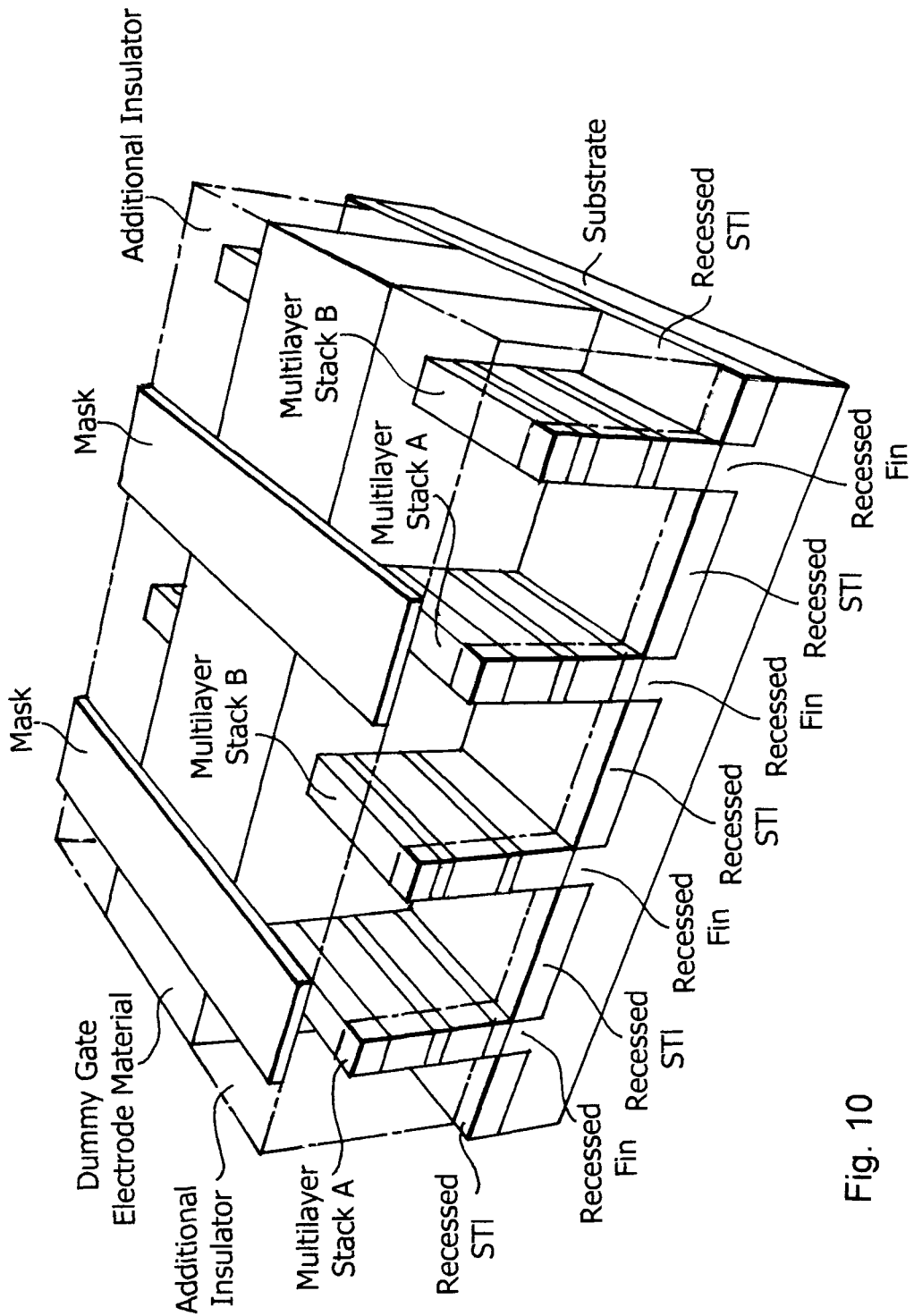
Figure 11:
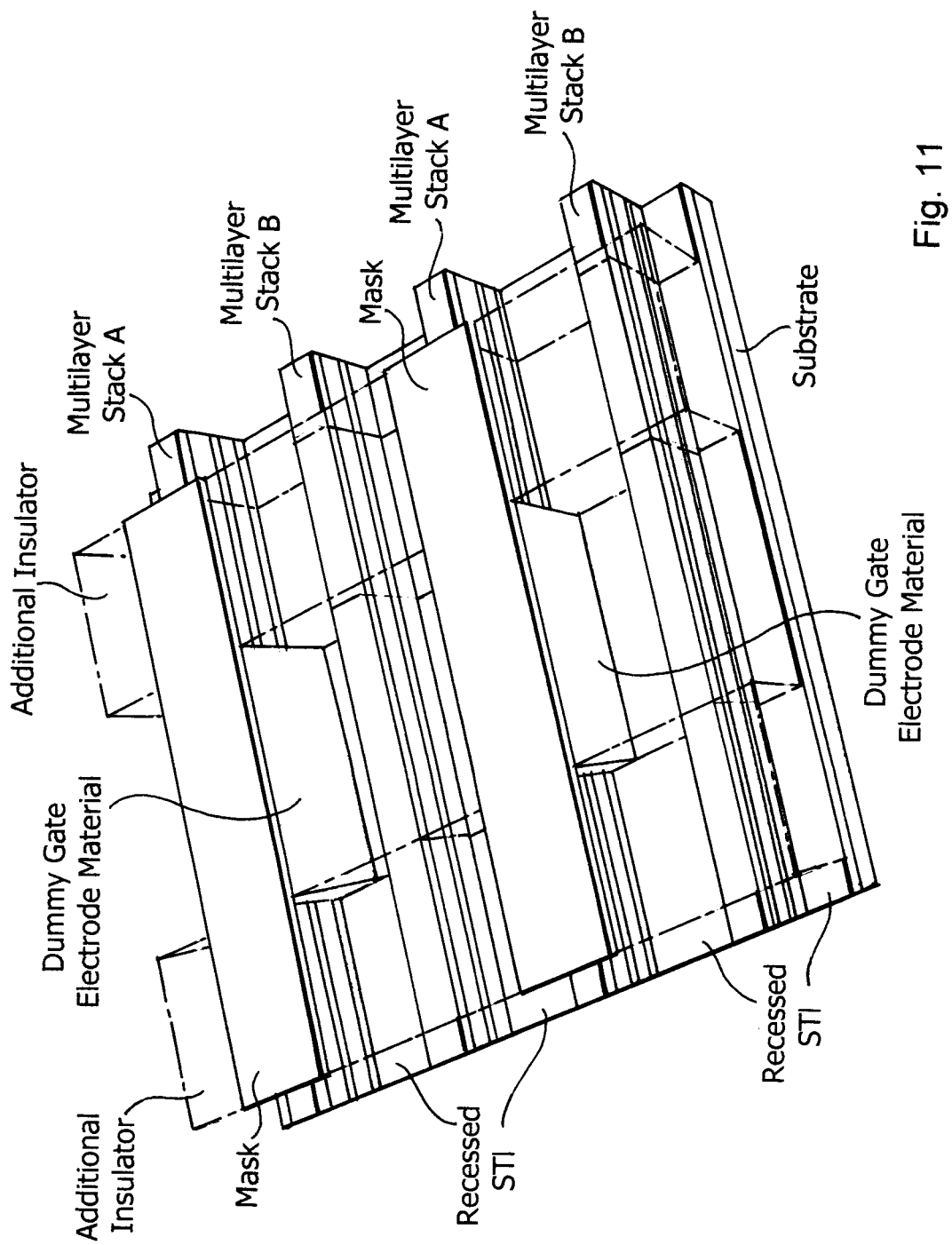

FIG. 10 illustrates a process and resulting structure wherein the type A multilayer stacks and corresponding dummy gate electrode material are masked, and FIG. 11 illustrates a process and resulting structure wherein the unmasked dummy gate electrode material (e.g., polysilicon) is etched to expose the channel area of the multilayer stacks B, in accordance with example embodiments of the present disclosure. Any suitable mask material and patterning and subsequent etch can be used. For instance, the mask can be implemented with silicon dioxide to protect the gate electrode material over the multilayer stacks A, and further assume that the additional insulator material is silicon dioxide and the dummy gate electrode material is polysilicon. In such an example case, the unmasked dummy gate electrode material can be selectively etched with, for instance, chlorine ($Cl_2$) and hydrogen bromide (HBr), which will remove the polysilicon but not the silicon dioxide. Numerous other mask and selective etch schemes can be used.

Figure 12:
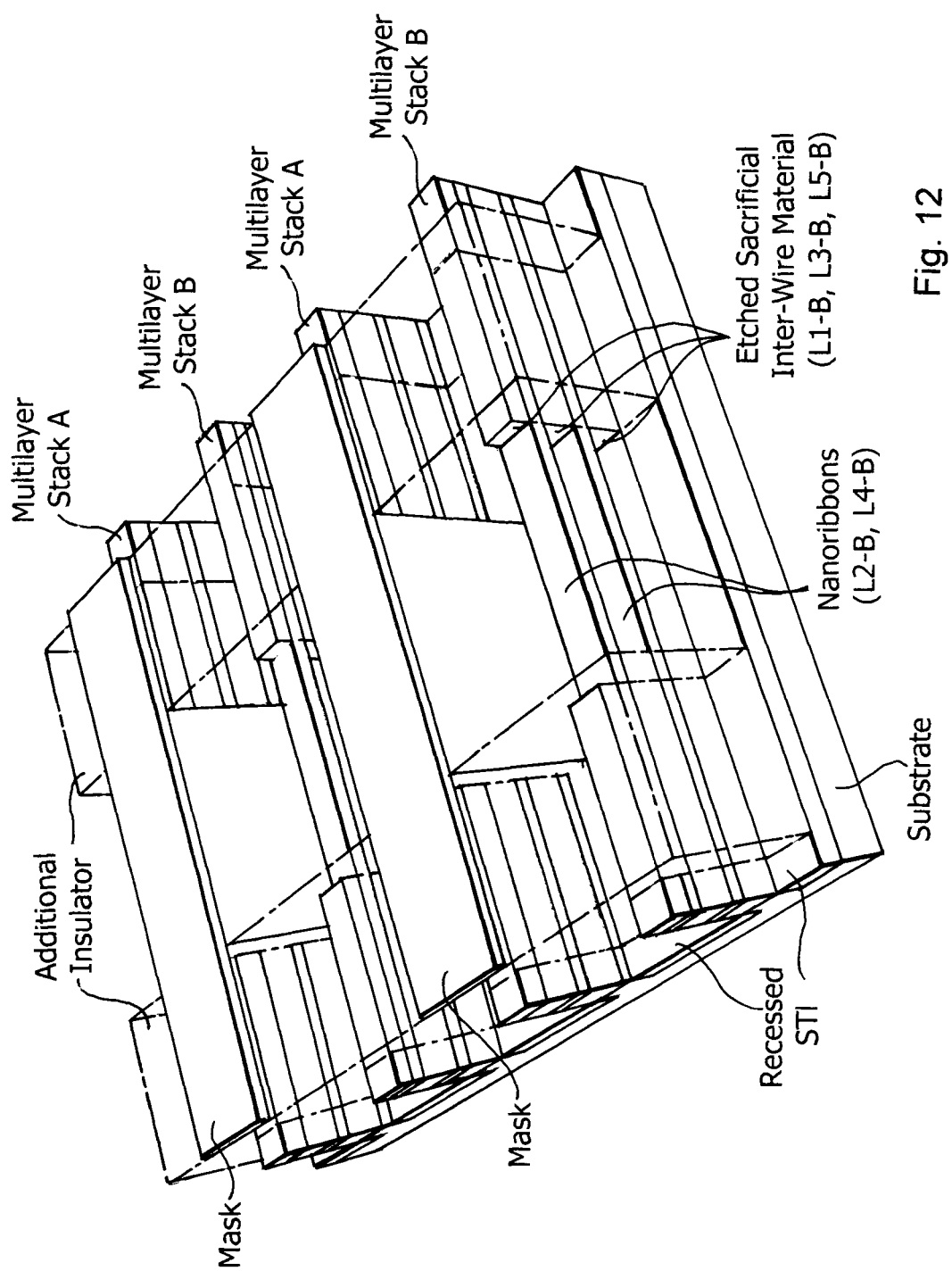

FIG. 12 illustrates a process and resulting structure wherein the sacrificial inter-wire material from the first channel type is etched out or otherwise removed, in accordance with an embodiment of the present disclosure. In some embodiments, this process can be referred to as ribbonizing the channel, depending on the dimensions of the remaining layers of the stack (L2-B and L4-B). Any suitable etch techniques can be used. In one example embodiment, the sacrificial layers L1-B, L3-B, and L5-B are implemented with silicon, and the channel nanowires L2-B and L4-B are implemented with SiGe. In such a case, the sacrificial silicon layers L1-B, L3-B, and L5-B can be etched selectively with a wet etch that selectively removes the silicon but does not remove the SiGe nanowire/nanoribbon structures L2-B and L4-B. Etch chemistries such as aqueous hydroxide chemistries, including ammonium hydroxide and potassium hydroxide, for example, may be utilized to selectively etch the silicon but leave the SiGe in place. As will be appreciated, and practically speaking, the terms 'wire' and 'ribbon' and variations of as used herein are functionally identical and generally may be used interchangeably. However, as will be further appreciated, a ribbon is structurally different from a wire with respect to height to width ratio. For instance, a wire may have a height to width ratio of 1:1, while a ribbon may have an asymmetric height to width ratio (e.g., 1:2, etc).

Figure 13:
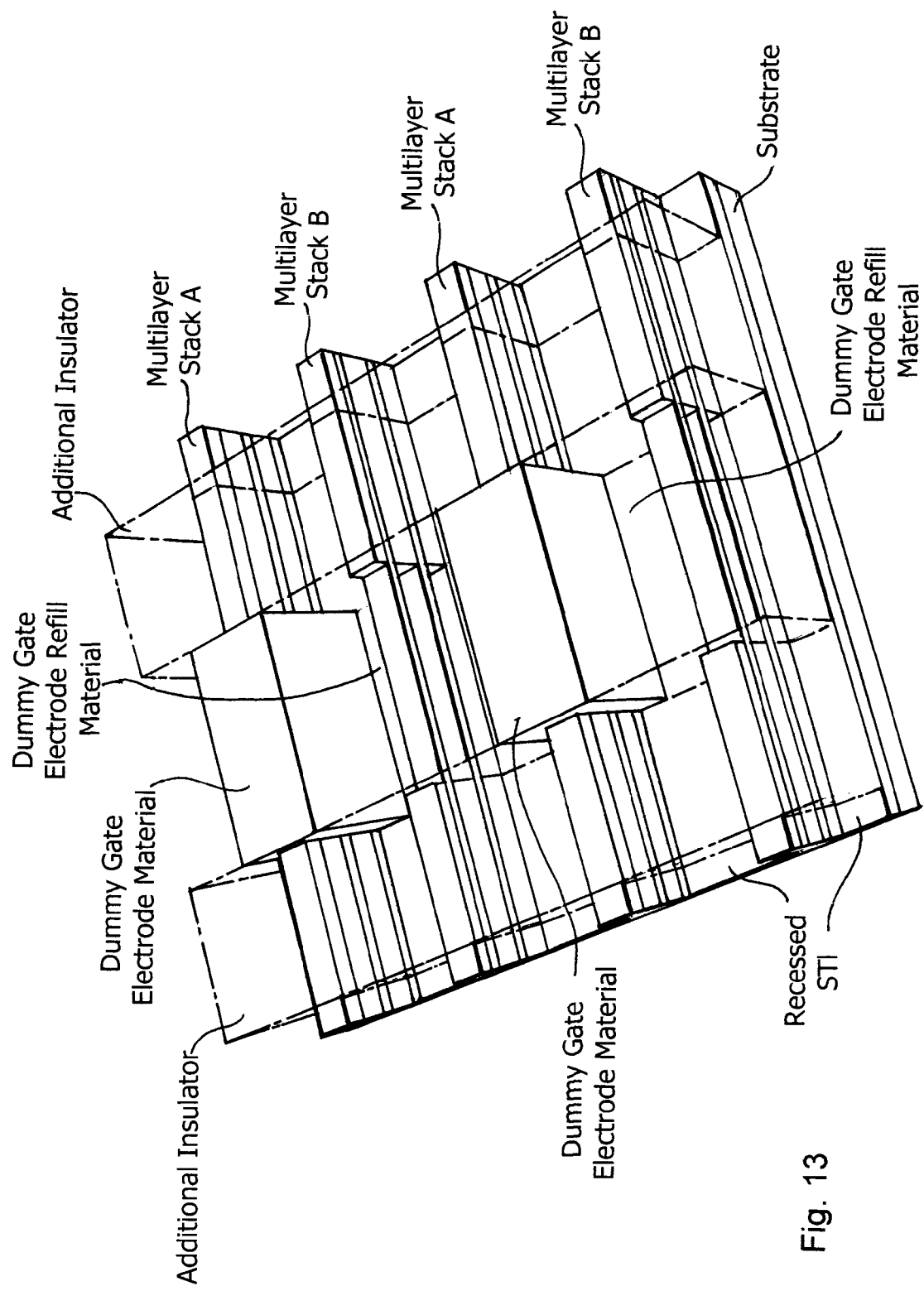

FIG. 13 illustrates a process and resulting structure wherein the exposed channel areas of the type B multilayer stacks are refilled with a dummy material that is different from the dummy gate electrode material and effectively acts as a mask over those type B multilayer stacks, in accordance with an embodiment of the present disclosure. This process may further include planarizing to remove any excess dummy fill material and/or any mask material over the type A multilayer stacks to be used for the first transistor device type, in some example embodiments.

Figure 14:
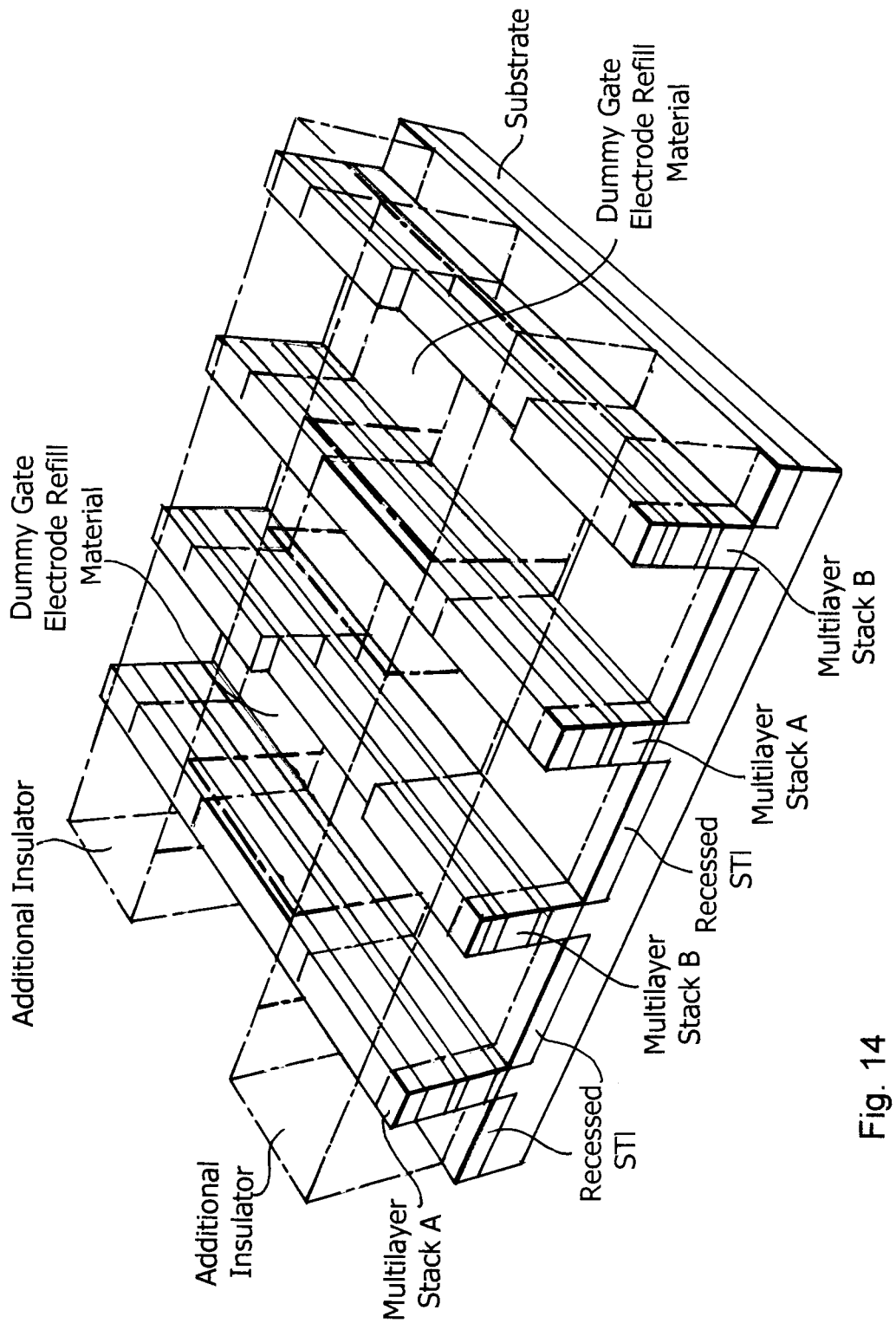

FIG. 14 illustrates a process and resulting structure wherein the remaining unmasked dummy gate electrode material is etched to expose the channel area of the multilayer stacks A, in accordance with example embodiments of the present disclosure. Any suitable material can be used to refill the dummy gate areas of the type B multilayer stacks, such as silicon dioxide or other material that can be readily removed but is resistant to the etch scheme for removing the remaining dummy gate electrode material over the multilayer stacks A. For instance, the refill material for the dummy gate areas of the type B multilayer stacks can be silicon dioxide, and further assume that the additional insulator material is silicon dioxide and the remaining dummy gate electrode material is polysilicon. In such an example case, the remaining dummy gate electrode material can be selectively etched with, for instance, $Cl_2$ and HBr, which will remove the polysilicon but not the silicon dioxide. As will be appreciated in light of this disclosure, numerous other selective etch schemes can be used.

FIG. 15a illustrates a process and resulting structure wherein the sacrificial inter-wire material from the second channel type is etched out or otherwise removed, in accordance with an embodiment of the present disclosure. As previously indicated with respect to the first channel type discussed with reference to FIG. 12, this process can be referred to as ribbonizing the channel, depending on the dimensions of the remaining layers of the stack (L1-A, L3-A and L5-A). Again, any suitable etch techniques can be used. In one example embodiment, the sacrificial layers L2-A and L4-A are implemented with SiGe, and the channel nanowires L1-A, L3-A and L5-A are implemented with silicon. In such a case, the sacrificial silicon layers L2-A and L4-A can be etched selectively with a wet etch that selectively removes the SiGe but does not remove the silicon nanowire structures L1-A, L3-A and L5-A. Etch chemistries such as carboxylic acid/nitric acid/hydrogen fluoride chemistry, and citric acid/nitric acid/hydrogen fluoride, for example, may be utilized to selectively etch the SiGe but leave the silicon in place. Thus, in embodiments where the multilayer structures A and B are implemented with alternating layers of silicon and SiGe, either the silicon layers may be removed from the multilayer fin structure to form SiGe nanowires, or the SiGe layers can be removed from the multilayer fin structure to form silicon channel nanowires.

Figure 15B:
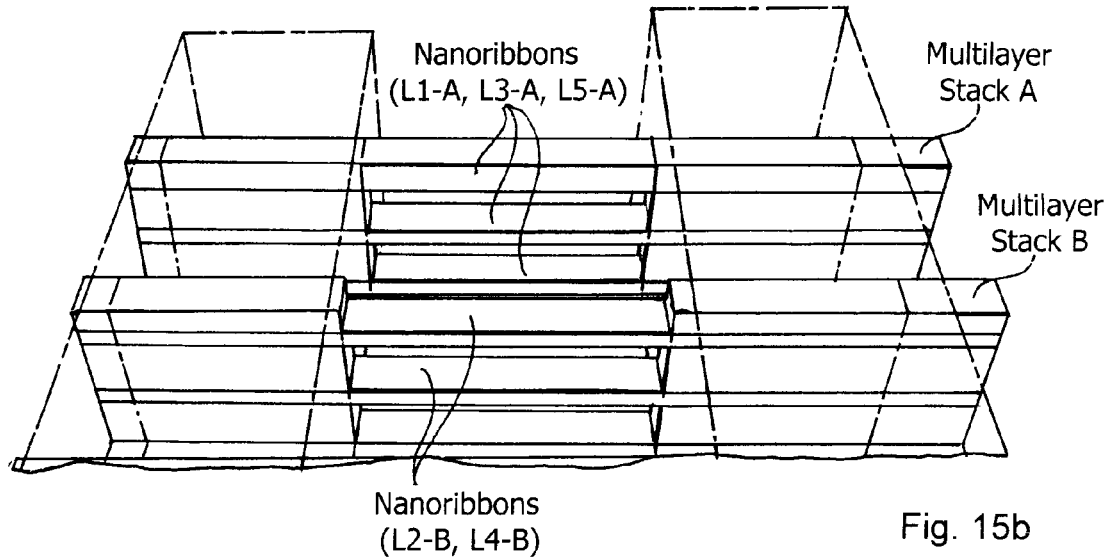

The exposed channel portions of the L2-B and L4-B layers of the type B multilayer stacks and the L1-A, L3-A and L5-A layers of the type A multilayer stacks shown in FIG. 15a and also in the partial alternate view of FIG. 15b, ultimately become channel regions in a nanowire-based structure, in accordance with one embodiment of the present disclosure. In some such embodiments, at the process stage depicted in FIGS. 15a-b, channel engineering or tuning can be performed. For example, in one embodiment, the exposed channel portions of the L2-B and L4-B layers of the type B multilayer stacks and/or the L1-A, L3-A and L5-A layers of the type A multilayer stacks can be thinned using oxidation and/or etch processes. Such a thinning process may be performed, for example, at the same time the wires are liberated from the neighboring sacrificial layers as described herein (e.g., via selective etching or other suitable removal process). Accordingly, the initial wires formed may have an initial thickness that is thinned to a size suitable for a channel region in a nanowire device, independent from the sizing of the source and drain regions of the device.

Diverse Wire/Ribbon Materials in Same Horizontal Plane

Figure 16:
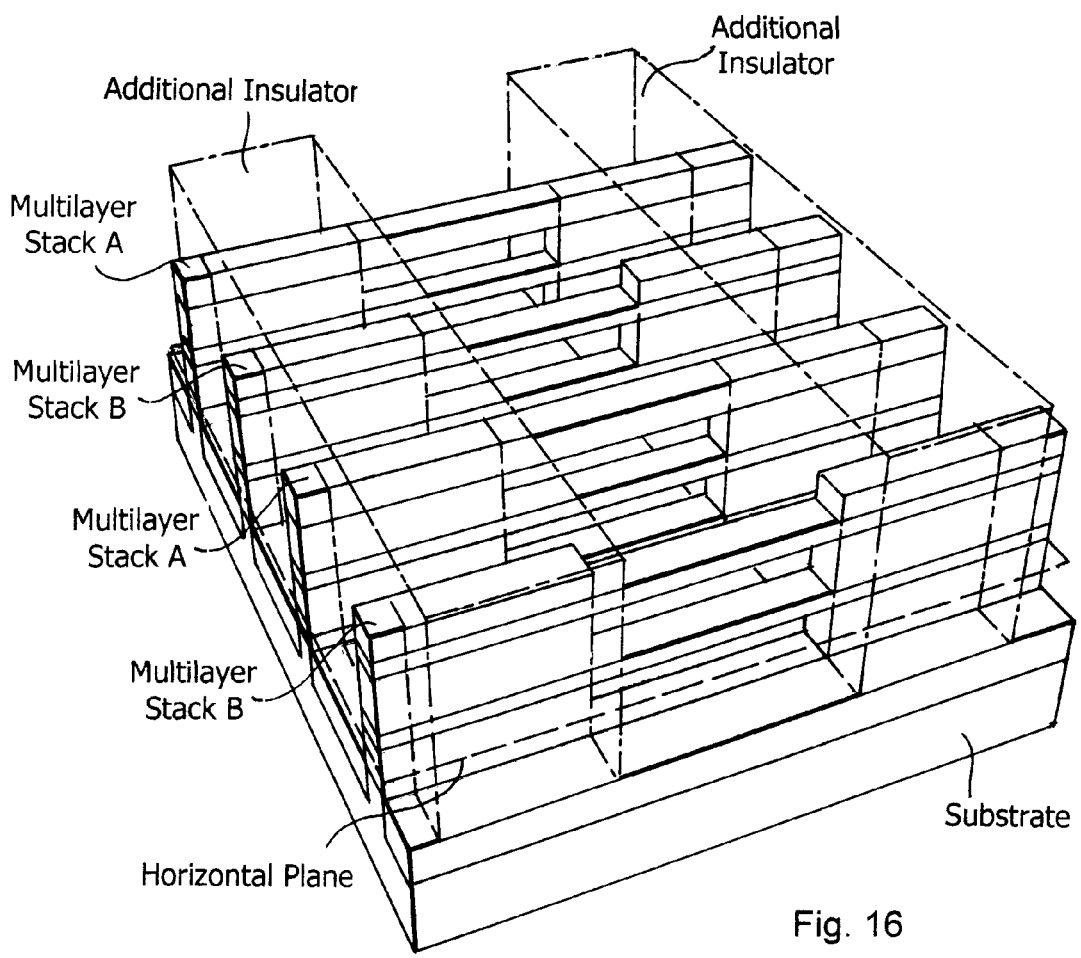
FIG. 16 illustrates a process for forming nanowire or nanoribbon transistor devices, as well as an example resulting structure, in accordance with another embodiment of the present disclosure.

Numerous alternative embodiments and variations will be apparent in light of this disclosure. For example, in the embodiments shown, the nanowires L1-A, L3-A and L5-A of the multilayer stacks A are not on the same horizontal plane as the nanowires L2-B and L4-B of the multilayer stacks B. In another example embodiment, the nanowires of one multilayer stack type are on the same horizontal plane as the nanowires of another multilayer stack type. One such embodiment is shown in FIG. 16, which shows a structure having four distinct multilayer stack types A, B, C, and D, wherein the nanowires/nanoribbons of the multilayer stack types A and C are on the same horizontal plane, and the nanowires/nanoribbons of the multilayer stack types B and D are on the same horizontal plane. In one such specific case, the nanowires/nanoribbons of the multilayer stack type A can be silicon, the nanowires/nanoribbons of the multilayer stack type C can be SiGe, the nanowires/nanoribbons of the multilayer stack type B can be gallium arsenide, and the nanowires/nanoribbons of the multilayer stack type D can be indium arsenide. As used herein, being in the same horizontal plane implies that there is at least some overlap between a nanowire/nanoribbon of a first multilayer stack type and a nanowire/nanoribbon of a second multilayer stack type, such that at least one common plane taken along a single axis cuts through both nanowires/nanoribbons of each of the first and second multilayer stack types. However, and as will be appreciated in light of this disclosure, note that such overlap is not necessary. In a more general sense, each multilayer stack type can be implemented independently of other multilayer stack types, and may be configured with or without sharing a common plane of existence and/or material composition relative to other multilayer stack types. A complete range of fin/multilayer stack diversity to homogeneity is enabled by the techniques provided herein.

Fin and Multilayer Stack Hybrid

Figure 17:
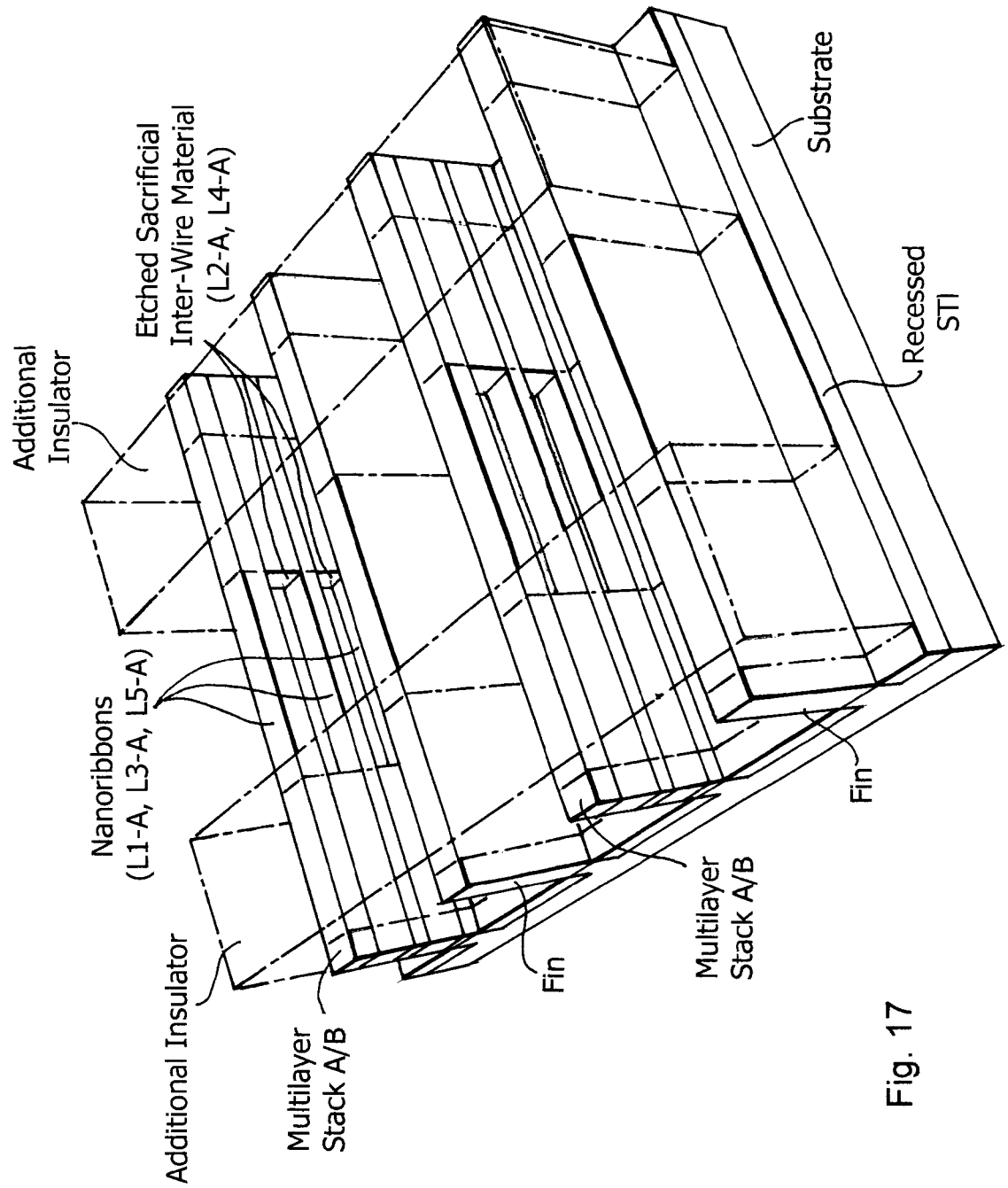
FIG. 17 illustrates a process for forming nanowire or nanoribbon transistor devices, as well as an example resulting structure, in accordance with another embodiment of the present disclosure.

FIG. 17 illustrates another process and resulting structure, wherein the nanowire device is configured with a combination of fins and multilayer stacks. The two fins shown may be implemented with the same or different materials, as can the two shown multilayer stacks A/B. For example, in one embodiment, the fins are implemented with a first alloying composition of SiGe, and the multilayer stacks could be implemented with silicon/SiGe stacks having a second SiGe composition. Alternatively, the fins could be implemented with, for example, column IV materials, and the multilayer stacks can be implemented with III-V materials. For instance, the fins can be silicon and/or a SiGe alloy, and the multilayer stacks can be alternating layers of gallium arsenide and aluminum gallium arsenide.

Numerous fin/stack materials and configurations will be apparent in light of this disclosure, and the present disclosure is not intended to be limited to any particular ones. Factors such as desired circuit performance, available materials, fab capability, and application specific details can be considered in customizing the nanowire stacks and/or fins as described herein. Such customization can be made with respect to, for example, n-type or p-type polarity, or any transistor performance factor such as frequency of operation, current density, power capability, gain, bandwidth, etc.

Gate and Source/Drain Formation

Following formation of the discrete channel regions such as in the variously example embodiments depicted in FIGS. 15a-b, 16, and 17, gate dielectric and gate electrode processing may be performed, and source and drain contacts may be added, in accordance with some example embodiments. Such post-channel processing can be carried out, for instance, as conventionally done. Other typical processing steps to facilitate the complete fabrication of a transistor-based integrated circuit will be apparent, such as intermediate planarization and cleaning processes, silicidation processes, contact and interconnect forming processes, and deposition-masking-etch processes. Moreover, some embodiments may employ a remove-and-replace process for forming the source/drain regions, if so desired (rather than using the as-is fin or multilayer stack). Numerous subsequent processing schemes will be apparent in light of this disclosure.

In some example embodiments, the gate dielectric can be, for example, any suitable oxide such as $SiO_2$ or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts. The gate electrode material can be, for example, polysilicon, silicon nitride, silicon carbide, or a metal layer (e.g., tungsten, titanium nitride, tantalum, tantalum nitride) although other suitable gate electrode materials can be used as well. The formed gate electrode may then be covered with a mask to protect it during subsequent processing. The gate dielectric, gate electrode and any optional mask materials can be generally referred to as a gate stack.

Once the gate stack is fabricated, the source/drain regions can be processed. This processing may include, for example, exposing the source/drain regions by etching or otherwise removing the additional insulator material from around the fin or multilayer stacks, so that source drain contacts can be provisioned, which may be accomplished using a silicide process, for example. Typical source drain contact materials include, for example, tungsten, titanium, silver, gold, aluminum, and alloys thereof.

Figure 18A:
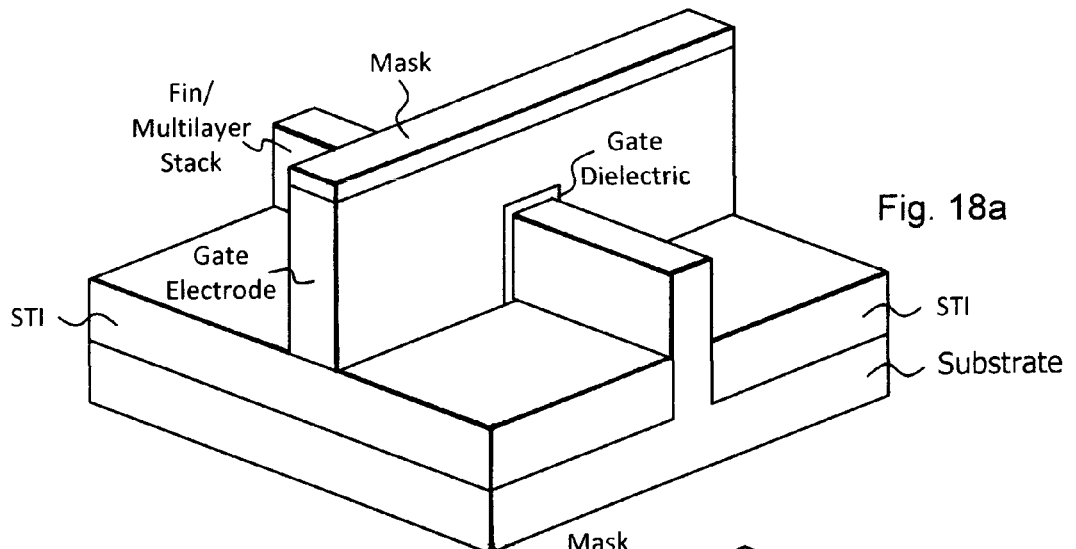
FIGS. 18a-18f illustrate a process for forming a bi-layer source/drain structure, in accordance with an example embodiment.
Figure 18B:
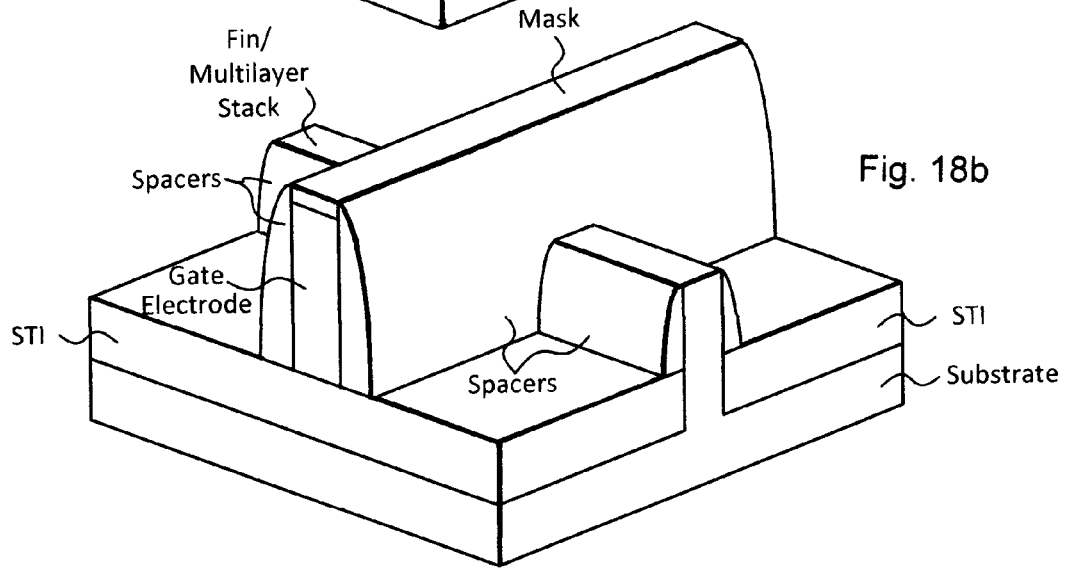
Figure 18C:
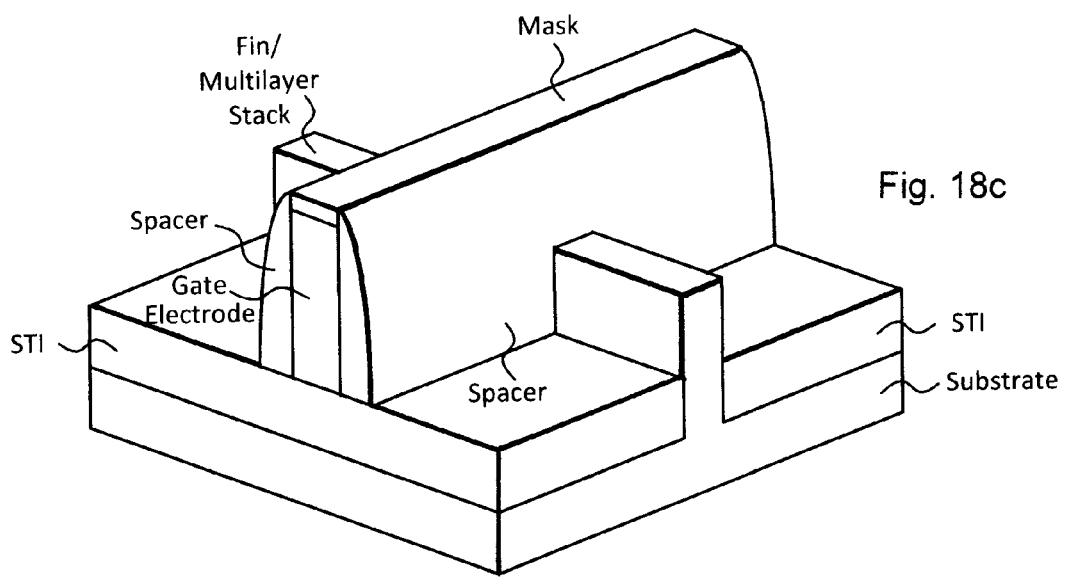
Figure 18D:
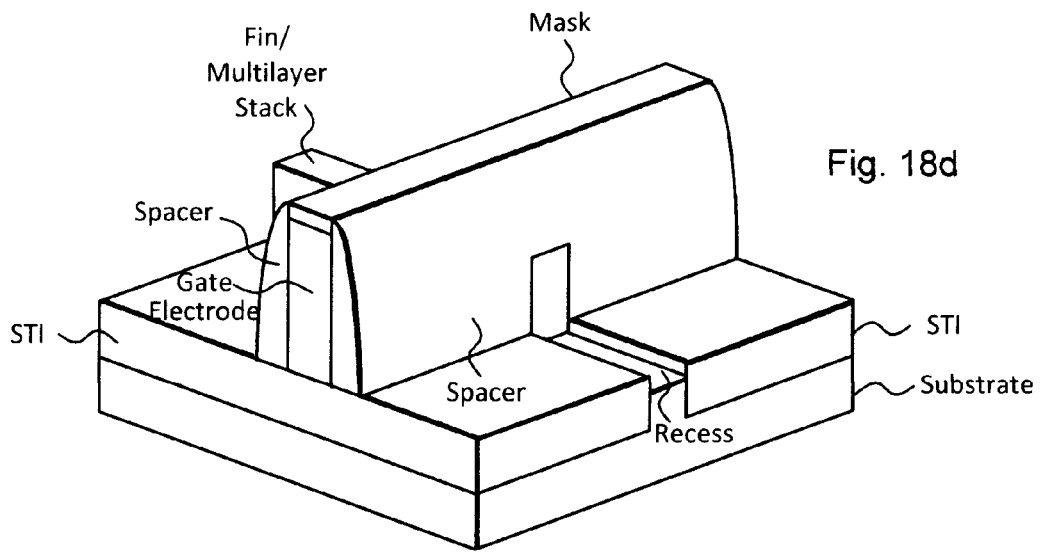
Figure 18E:
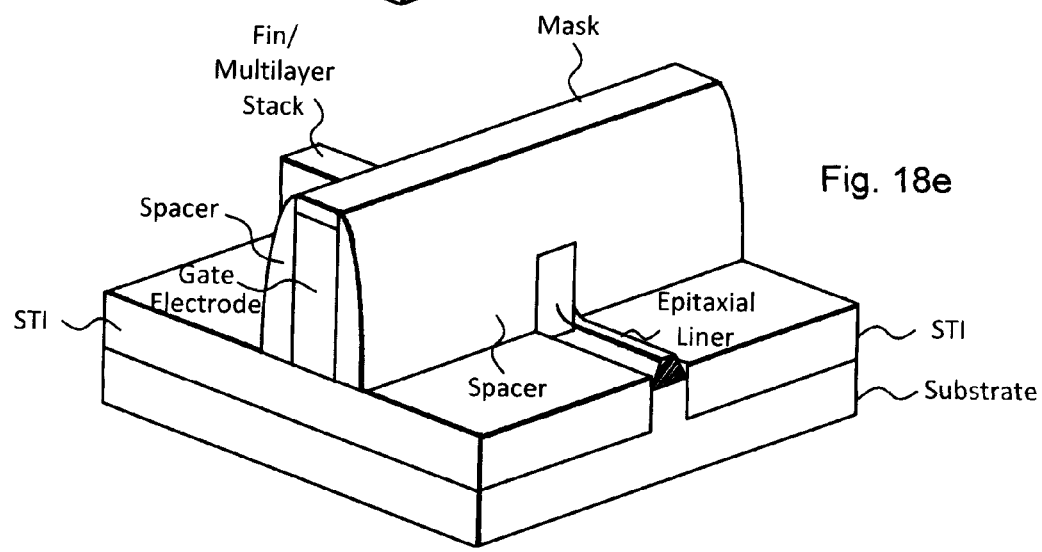
Figure 18F:
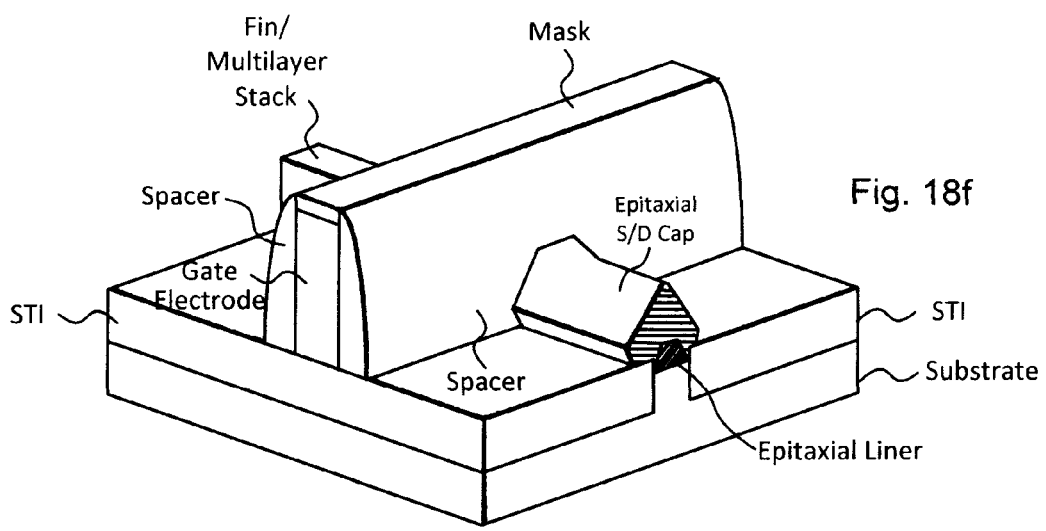

As previously explained, some embodiments may employ a remove-and-replace process for forming the source/drain regions, if so desired (rather than using the as-is fin or multilayer stack). FIGS. 18a-18f illustrate one such example process to provide a transistor structure having a bi-layer source/drain structure, in accordance with an example embodiment. As will be appreciated, only one fin/multilayer stack is shown for purposes of simplifying the discussion, but the same concepts can equally be applied to a structure having any number of fins/multilayer stacks and in any number of configurations as described herein. FIG. 18a shows a gate electrode formed over three surfaces of a fin to form three gates (i.e., a tri-gate device), or one or more nanowires to provide a gate-all-around device. A gate dielectric material is provided between the fin/multilayer stack and the gate electrode, and a hardmask is formed on top of the gate electrode. FIG. 18b illustrates the resulting structure after deposition of insulating material and subsequent etch that leaves a coating of the insulator material on all vertical surfaces, so as to provide spacers on the sidewalls of the gate electrode and fin/multilayer stack. FIG. 18c illustrates the resulting structure after an additional etch treatment to eliminate excess insulating/spacer material from sidewalls of the fin/multilayer stack, thereby leaving only spacers opposite sidewalls of the gate electrode. FIG. 18d illustrates the resulting structure after a recess etch to remove the fin/multilayer stack in the source/drain region of the substrate, thereby forming the recess such that the recessed fin/multilayer stack has a top surface that is below the STI. Note that other embodiments may not be recessed (e.g., source/drain region is flush with the STI layer or above the STI layer). FIG. 18e illustrates the resulting structure after growth of an epitaxial liner, which in some embodiments may be thin, p-type and contain significant fraction of silicon (e.g., silicon or SiGe having 70 atomic % silicon), or be pure germanium (e.g., a separate layer of germanium, or a non-detectable layer that is integrated or otherwise included in the composition of the caps to be discussed in turn). FIG. 18f illustrates the resulting structure after growth of an epitaxial source/drain cap, which in some example embodiments can be p-type, and comprise primarily germanium but may contain less than 20 atomic % tin or other suitable alloying material, as previously explained. As will further be appreciated, note that an alternative to the tri-gate configuration is a double-gate architecture, which would include a dielectric/isolation layer on top of the fin. Further note that the example shapes of the liner and cap making up the source/drain regions shown in FIGS. 18e-f are not intended to limit the present disclosure to any particular source/drain types or formation processes, and other source/drain shapes will be apparent in light of this disclosure (e.g., round, square or rectangular source/drain regions may be implemented).

Figure 19A:
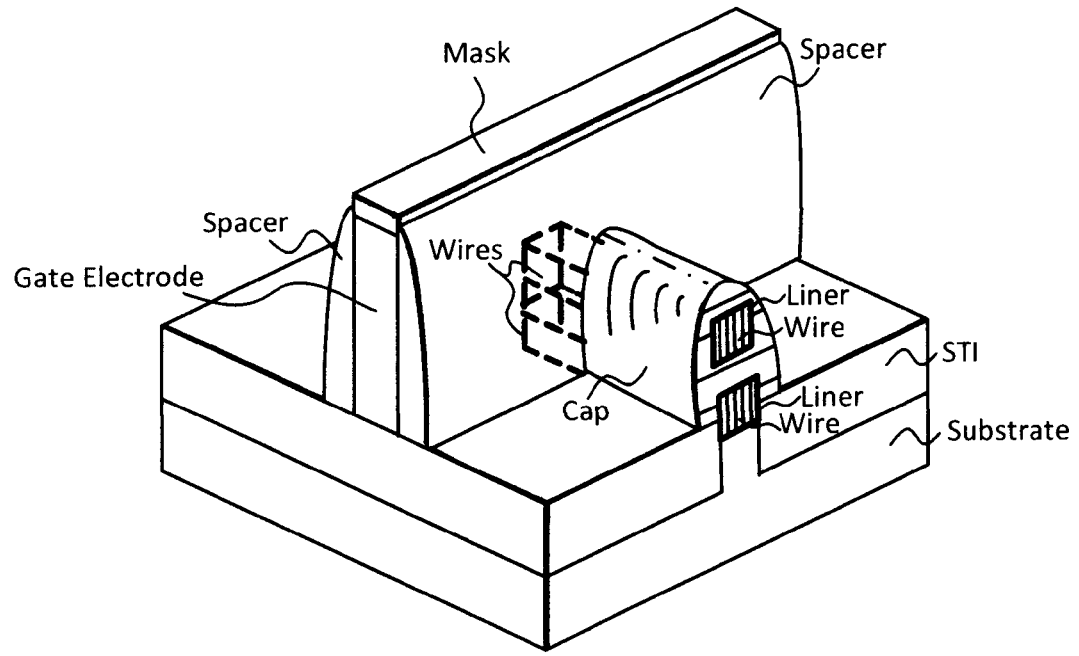
FIGS. 19a-19b illustrate a process for forming a bi-layer source/drain structure, in accordance with an example embodiment.
Figure 19B:
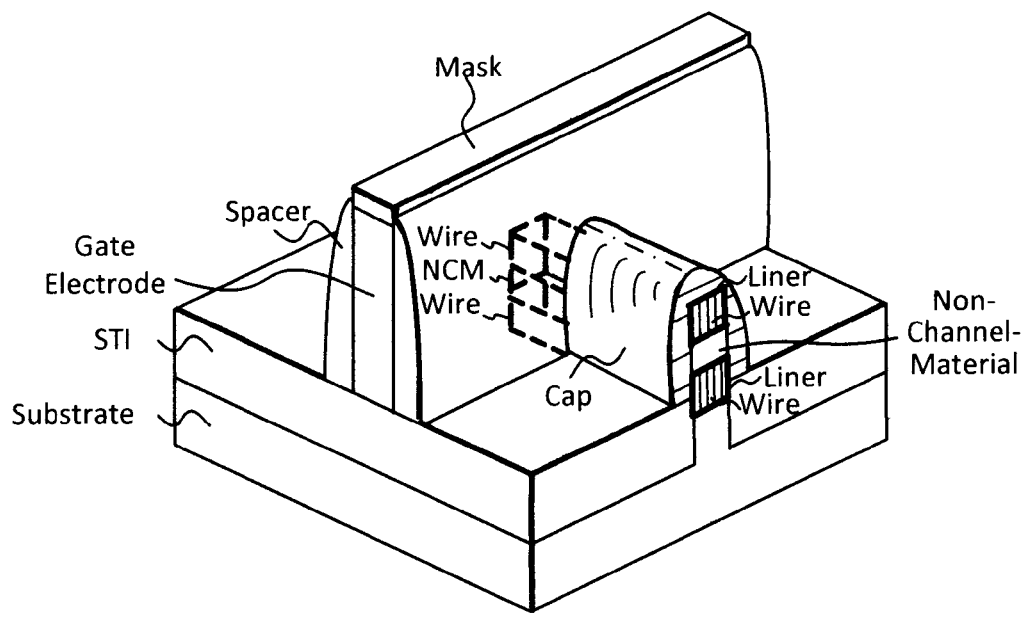

FIG. 19a illustrates a nanowire transistor structure having a bi-layer source/drain structure, in accordance with another example embodiment. Depending on the particular design, some nanowire transistors have, for instance, four effective gates. FIG. 19a illustrates a nanowire channel architecture having two nanowires, although other embodiments can have any number of wires. The nanowires can be implemented, for example, with p-type silicon or germanium or SiGe nanowire. As can be seen, one nanowire is formed or otherwise provided in a recess of the substrate and the other nanowire effectively floats in the source/drain material bi-layer construction comprising a liner and a cap layer. Just as with the fin configuration, note that the nanowire can be replaced in the source/drain regions with a bi-layer construction of source/drain material (e.g., relatively thin silicon or germanium or SiGe liner and relatively thick high concentration germanium cap). Alternatively, the bi-layer construction can be provided around the originally formed nanowire as shown (where the liner is provided around nanowire, and the cap is then provided around the liner). FIG. 19b also illustrates a nanowire configuration having multiple nanowires, but in this example case, non-channel-material (NCM) is not removed from between the individual nanowires during the nanowire forming process, which can be carried out as previously described. Thus, one nanowire is provided in a recess of the substrate and the other nanowire effectively sits on top of the non-channel-material. Note the nanowires are active through the channel, but the non-channel-material is not. As can be seen, the bi-layer source/drain construction of the liner and cap is provided around all other exposed surfaces of the nanowires.

As will be appreciated, the depicted methodology can be carried out using any suitable standard semiconductor processes, including lithography, chemical vapor deposition (CVD), atomic layer deposition (ALD), spin-on deposition (SOD), physical vapor deposition (PVD), wet and dry etching (e.g., isotropic and/or anisotropic), depending on the materials used and desired profiles. Alternate deposition techniques may be used as well, for instance, various material layers may be thermally grown. As will be further appreciated in light of this disclosure, any number of suitable materials, layer geometries, and formation processes can be used to implement an embodiment of the present disclosure, so as to provide a custom nanowire device or structure as described herein.

Example System

Figure 20:
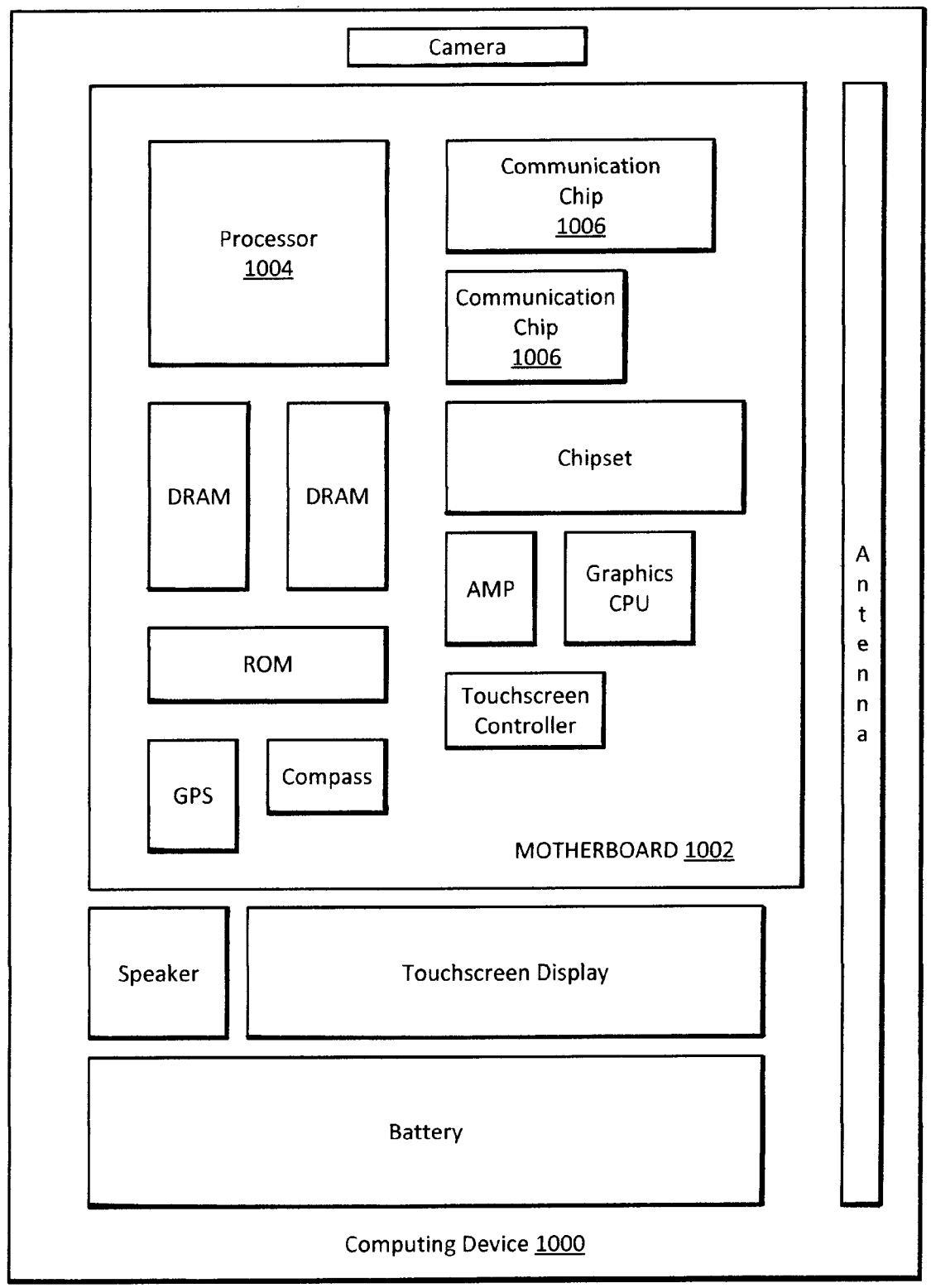
FIG. 20 illustrates a computing system implemented with one or more integrated circuit structures configured in accordance with an embodiment of the present disclosure.

FIG. 20 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with nanowire transistors having customized channels. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present disclosure, the integrated circuit die of the processor 1004 includes one or more nanowire transistors having customized channels as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more nanowire transistors having customized channels as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs nanowire transistor devices as described herein (e.g., CMOS devices having both p and n type devices configured with customized channels on the same die). As will be appreciated in light of this disclosure, various embodiments of the present disclosure can be used to improve performance on products fabricated at any process node (e.g., in the micron range, or sub-micron and beyond) by allowing for the use of nanowire transistors having customized and diverse channel configurations (e.g., Si, SiGe, or Si/SiGe) on the same die.

Numerous embodiments will be apparent, and features described herein can be combined in any number of configurations. One example embodiment of the present disclosure provides a method for forming a nanowire transistor structure. The method includes forming a plurality of fins on a substrate, each fin extending from the substrate, and forming a shallow trench isolation on opposing sides of each fin. The method further includes masking a first set of the fins so as to leave a first set of unmasked sacrificial fins, recessing the first set of unmasked sacrificial fins to provide a first set of recesses, and forming a multilayer stack of a first type in each recess of the first set of recesses, each multilayer stack of the first type comprising at least two different layers at least one of which will be formed into a channel nanowire of the transistor structure. In some cases, the method may include planarizing each multilayer stack of the first type. In some such cases, planarizing each multilayer stack of the first type includes removing masking material over the first set of fins. In some cases, the method may include masking each of the multilayer stacks of the first type so as to leave a second set of unmasked sacrificial fins, recessing the second set of unmasked sacrificial fins to provide a second set of recesses, and forming a multilayer stack of a second type in each recess of the second set of recesses, each multilayer stack of the second type comprising at least two different layers. In some such cases, the multilayer stacks of the first and second types are each configured with layers to be formed into nanowires and sacrificial layers, and at least one common plane taken along a single axis cuts through respective nanowire layers of at least one multilayer stack of the first type and at least one multilayer stack of the second type. In other such cases, the multilayer stacks of the first and second types are each configured with layers to be formed into nanowires and sacrificial layers, and there is no common plane taken along a single axis that cuts through respective nanowire layers of the first and second type multilayer stacks. In some cases, the multilayer stacks of the first type are configured differently (e.g., with respect to composition and/or strain) than the multilayer stacks of the second type. For instance, in one example case, the multilayer stacks of the first type are configured for one of PMOS or NMOS (e.g., PMOS) and the multilayer stacks of the second type are configured for the other of PMOS or NMOS (e.g., NMOS). In some cases, the method may include planarizing each multilayer stack of the second type. In one such case, planarizing each multilayer stack of the second type includes removing masking material over the multilayer stacks of the first type. In some embodiments, the method includes at least one of: recessing shallow trench isolation on the substrate to expose sidewalls of the multilayer stacks of the first type; forming a dummy gate structure over the multilayer stacks of the first type; forming an additional insulator layer over multilayer stacks of the first type to either side of the dummy gate structure; and planarizing the additional insulator layer to top of the dummy gate structure. In some such cases, the method may further include: masking a set of fins and/or multilayer stacks formed on the substrate and to be used for a first type of transistor device, so as to leave a set of unmasked multilayer stacks formed on the substrate and to be used for a second type of transistor device; etching unmasked portions of the dummy gate structure to expose a first channel area of each multilayer stack of the set of unmasked multilayer stacks to be used for the second type of transistor device; and etching out sacrificial inter-wire material from each first channel area to provide one or more channel nanowires for each of the second type transistor devices. In one such case, the method may further include at least one of: refilling the dummy gate structure to cover the first channel areas; and planarizing the refilled dummy gate structure to remove masking material over the first set of fins and/or multilayer stacks to be used for the first transistor device type. In some cases, the method may include etching remaining dummy gate structure to expose a second channel area of each of the fins and/or multilayer stacks formed on the substrate and to be used for the first type of transistor device. In one such case, the second channel areas are of multilayer stacks, and the method further includes etching out sacrificial inter-wire material from each second channel area to provide one or more channel nanowires of the first type transistor device. In another such case, the second channel areas are of fins and not multilayer stacks. In some cases, the method further includes forming a gate stack for each of the first and second device types, and forming source/drain regions for each of the first and second device types. Numerous variations will be apparent. For instance, another embodiment provides an integrated circuit formed by the method as variously defined in this paragraph.

Another embodiment of the present disclosure provides a nanowire transistor device. The device includes a first plurality of fins on a substrate, each fin of the first plurality extending from the substrate. The device further includes a multilayer stack of a first type on each fin of the first plurality of fins, each multilayer stack of the first type comprising a channel area having one or more nanowires. The device further includes a second plurality of fins on the substrate, each fin of the second plurality extending from the substrate. The device further includes a multilayer stack of a second type on each fin of the second plurality of fins, each multilayer stack of the second type comprising a channel area having one or more nanowires. The one or more nanowires of the multilayer stacks of the first type are configured differently (e.g., with respect to composition and/or strain) than the one or more nanowires of the multilayer stacks of the second type. In some cases, the device includes a shallow trench isolation on opposing sides of each fin of the first and second plurality of fins. In some cases, at least one common plane taken along a single axis cuts through respective nanowires of at least one multilayer stack of the first type and at least one multilayer stack of the second type. In other cases, there is no common plane taken along a single axis that cuts through respective nanowires of both the first and second type multilayer stacks. In some cases, the multilayer stacks of the first type are configured for one of PMOS or NMOS and the multilayer stacks of the second type are configured for the other of PMOS or NMOS. In some cases, the multilayer stacks of the first and second types are each configured with nanowire layers from which nanowires are formed and sacrificial layers that are removed in the channel areas. In some cases, the device may include a gate stack and source/drain regions. Another embodiment of the present disclosure provides an integrated circuit comprising the device as variously defined in this paragraph. Another embodiment provides a system including that integrated circuit.

Another embodiment of the present disclosure provides a nanowire transistor device. In this example cases, the device includes a plurality of first fins on a substrate, each first fin extending from the substrate. The device further includes a multilayer stack of a first type on each first fin, each multilayer stack of the first type comprising a channel area having one or more nanowires. The device further includes a plurality of second fins on the substrate, each second fin extending from the substrate higher than the first fins and comprising a channel area. The one or more nanowires of the multilayer stacks of the first type are configured differently than the second fins. In some cases, the device may include a shallow trench isolation on opposing sides of each first fin and second fin. In some cases, the multilayer stacks of the first type are configured for one of PMOS or NMOS and the second fins are configured for the other of PMOS or NMOS. In some cases, the device may include a gate stack and source/drain regions. Another embodiment of the present disclosure provides an integrated circuit comprising the device as variously defined in this paragraph. Another embodiment provides a system including that integrated circuit.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit (IC) comprising:
   a first transistor above a substrate, the first transistor including a first channel region that includes a first semiconductor material nanowire, the first transistor further including a first gate structure around the first semiconductor material nanowire; and
   a second transistor above the substrate, the second transistor including a second channel region that includes a second semiconductor material nanowire, the second transistor further including a second gate structure around the second semiconductor material nanowire;
   wherein at least one common horizontal plane passes through each of the first and second semiconductor material nanowires, and
   wherein the first and second semiconductor material nanowires include at least one of relatively different material compositions and relatively different thicknesses.

2. The IC of claim 1, wherein each of the first and second semiconductor material nanowires includes at least one of silicon, germanium, and group III-V semiconductor material.

3. The IC of claim 1, wherein one of the first and second semiconductor material nanowires includes group IV semiconductor material and the other of the first and second semiconductor material nanowires includes group III-V semiconductor material.

4. The IC of claim 1, wherein one of the first and second semiconductor material nanowires includes n-type dopant and the other of the first and second semiconductor material nanowires includes p-type dopant.

5. The IC of claim 1, wherein the first and second semiconductor material nanowires include relatively different thicknesses.

6. The IC of claim 1, wherein the first transistor further includes source and drain regions adjacent the first channel region, and wherein the second transistor further includes source and drain regions adjacent the second channel region.

7. The IC of claim 1, wherein one of the first and second transistors is an n-type metal oxide semiconductor (NMOS) device and the other of the first and second transistors is a p-type metal oxide semiconductor (PMOS) device.

8. The IC of claim 7, further comprising a complementary metal oxide semiconductor (CMOS) device that includes the first and second transistors.

9. The IC of claim 1, wherein the first gate structure is electrically connected to the second gate structure.

10. An integrated circuit (IC) comprising:
    a first transistor above a silicon substrate, the first transistor including a first channel region that includes a first semiconductor material nanowire, the first transistor further including a first gate structure around the first semiconductor material nanowire; and
    a second transistor above the silicon substrate, the second transistor including a second channel region that includes a second semiconductor material nanowire, the second transistor further including a second gate structure around the second semiconductor material nanowire;
    wherein at least one common horizontal plane passes through each of the first and second semiconductor material nanowires, and
    wherein the first and second semiconductor material nanowires include relatively different material compositions.

11. The IC of claim 10, wherein the first semiconductor material nanowire includes silicon germanium including a first silicon concentration and the second semiconductor material nanowire includes silicon germanium including a second silicon concentration different than the first silicon concentration.

12. The IC of claim 10, wherein the first and second semiconductor material nanowires also include relatively different thicknesses in a vertical direction.

13. The IC of claim 10, wherein the first gate structure includes a gate electrode and a gate dielectric between the gate electrode and the first semiconductor material nanowire, and wherein the second gate structure includes a gate electrode and a gate dielectric between the gate electrode and the second semiconductor material nanowire.

14. The IC of claim 13, wherein the gate electrode of the first gate structure is electrically connected to the gate electrode of the second gate structure.

15. An integrated circuit (IC) comprising:
    a first transistor above a substrate, the first transistor including a first channel region that includes a semiconductor material nanowire, the first transistor further including a first gate structure around the semiconductor material nanowire; and
    a second transistor above the substrate, the second transistor including a second channel region that includes a semiconductor material fin, the second transistor further including a second gate structure adjacent three sides of the semiconductor material fin;
    wherein at least one common horizontal plane passes through each of the semiconductor material nanowire and the semiconductor material fin, and
    wherein the semiconductor material nanowire and the semiconductor material fin include relatively different material compositions.

16. The IC of claim 15, wherein one of the semiconductor material nanowire and the semiconductor material fin includes group IV semiconductor material and the other of the semiconductor material nanowire and the semiconductor material fin includes group III-V semiconductor material.

17. The IC of claim 15, wherein the semiconductor material fin is not native to the substrate.

18. The IC of claim 15, wherein the first transistor further includes source and drain regions adjacent the first channel region, and wherein the second transistor further includes source and drain regions adjacent the second channel region.

19. The IC of claim 15, wherein one of the first and second transistors is an n-type metal oxide semiconductor (NMOS) device and the other of the first and second transistors is a p-type metal oxide semiconductor (PMOS) device.

20. The IC of claim 19, further comprising a complementary metal oxide semiconductor (CMOS) device that includes the first and second transistors.

\* \* \* \* \*